(12) United States Patent
Yao

(10) Patent No.: US 9,628,915 B2
(45) Date of Patent: Apr. 18, 2017

(54) HANDHELD PORTABLE HIGH FIDELITY MUSIC PLAYBACK WITH STREAMING AND WIFI ROUTING ABILITY

(71) Applicant: Changzhi Yao, Shenzhen (CN)

(72) Inventor: Changzhi Yao, Shenzhen (CN)

(73) Assignee: ECHOBOX AUDIO, LLC, Bellevue, WA (US)

( * ) Notice: Subject to any disclaimer, the term of this patent is extended or adjusted under 35 U.S.C. 154(b) by 0 days.

(21) Appl. No.: 14/590,727

(22) Filed: Jan. 6, 2015

(65) Prior Publication Data
US 2017/0085991 A1 Mar. 23, 2017

(51) Int. Cl.
| H04B 1/00 | (2006.01) |
| H04R 5/04 | (2006.01) |
| G10L 19/16 | (2013.01) |
| H03F 3/45 | (2006.01) |
| H03F 3/181 | (2006.01) |
| H03F 1/02 | (2006.01) |

(52) U.S. Cl.
CPC ............. *H04R 5/04* (2013.01); *G10L 19/167* (2013.01); *H03F 1/02* (2013.01); *H03F 3/181* (2013.01); *H03F 3/45* (2013.01); *H03F 2200/504* (2013.01); *H04R 2420/09* (2013.01)

(58) Field of Classification Search
CPC ............................ H04B 1/0028; H04B 1/207
USPC ................... 455/550.1, 569.1, 563, 572, 574
See application file for complete search history.

(56) References Cited

U.S. PATENT DOCUMENTS

| 2003/0091183 A1* | 5/2003 | Holcombe | H04B 14/026 379/399.01 |
| 2005/0143149 A1* | 6/2005 | Becker | H04M 1/725 455/575.1 |
| 2010/0316237 A1* | 12/2010 | Elberbaum | H04M 11/025 381/300 |
| 2016/0197587 A1* | 7/2016 | Arknæs-Pedersen | H03F 1/565 381/82 |

\* cited by examiner

*Primary Examiner* — Ping Hsieh
(74) *Attorney, Agent, or Firm* — Jie Tan; JT Law Services, PC

(57) ABSTRACT

A circuit design for a portable audio data processing and high fidelity playback device having a multi-core digital signal micro-processor, embedded with a set of digital audio CODECs for encoding and decoding 24 bit audio data in any current format, being mounted onto said PCB board. A set of differential operational audio amplifiers is powered independently with a dual power supply management circuit having a set of low-noise linear regulators.

30 Claims, 24 Drawing Sheets

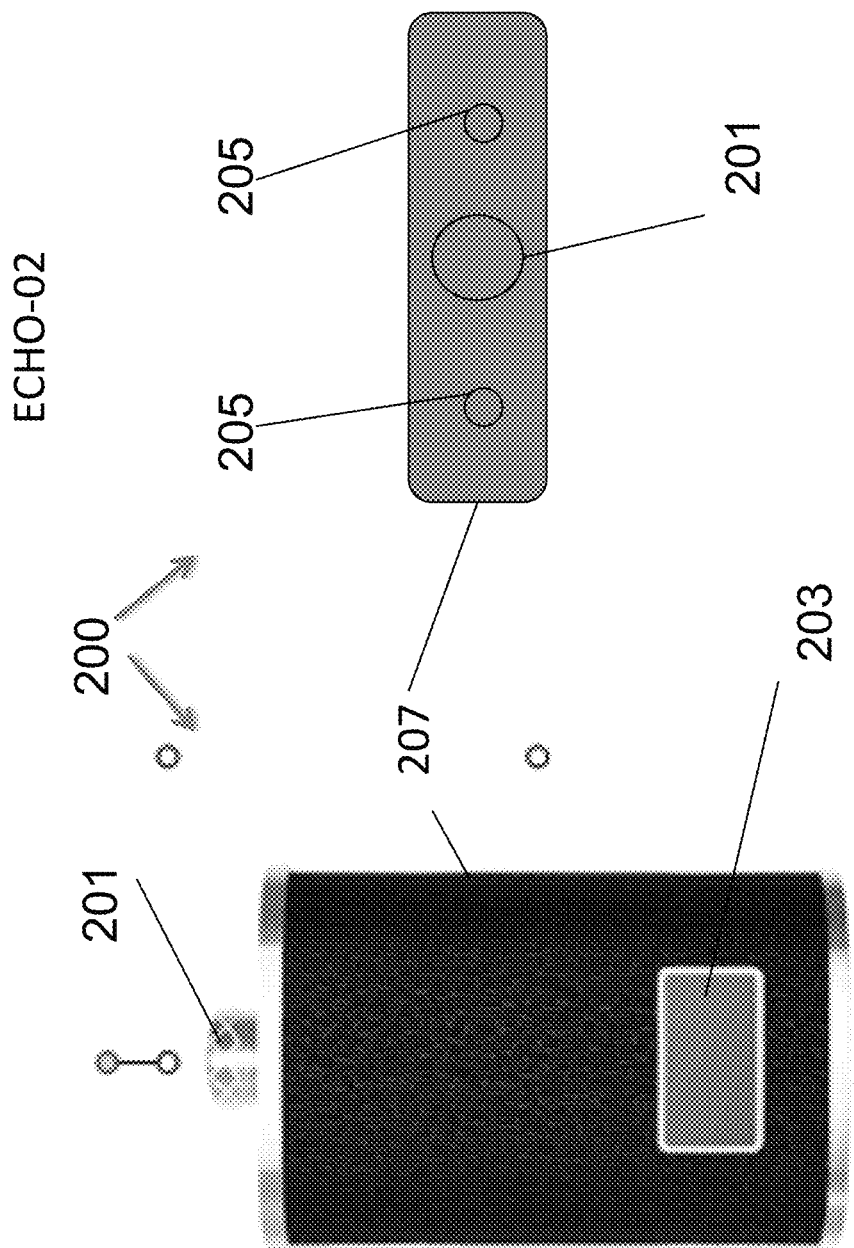

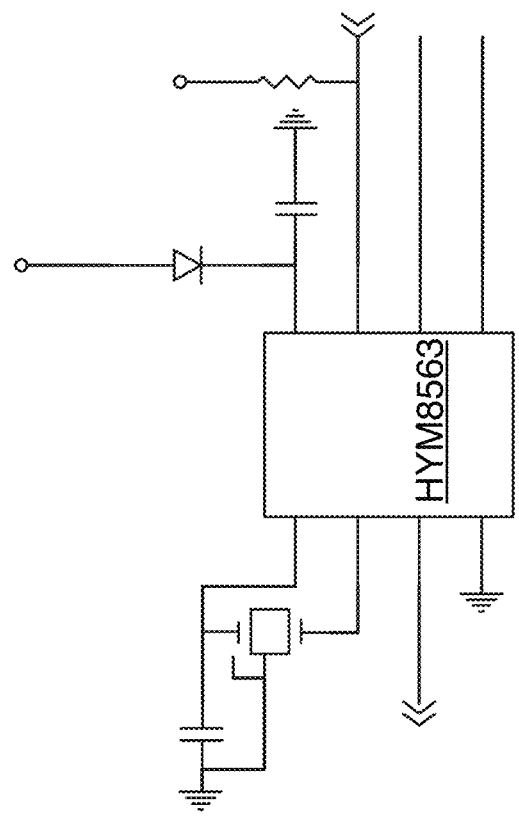
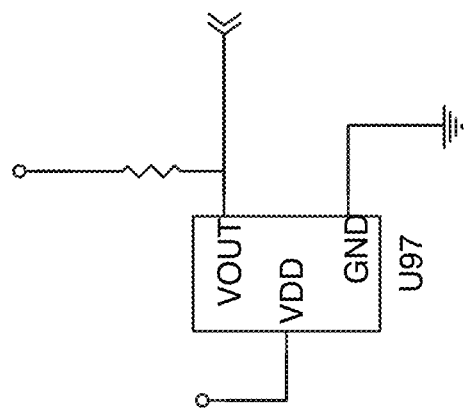
FIG. 9

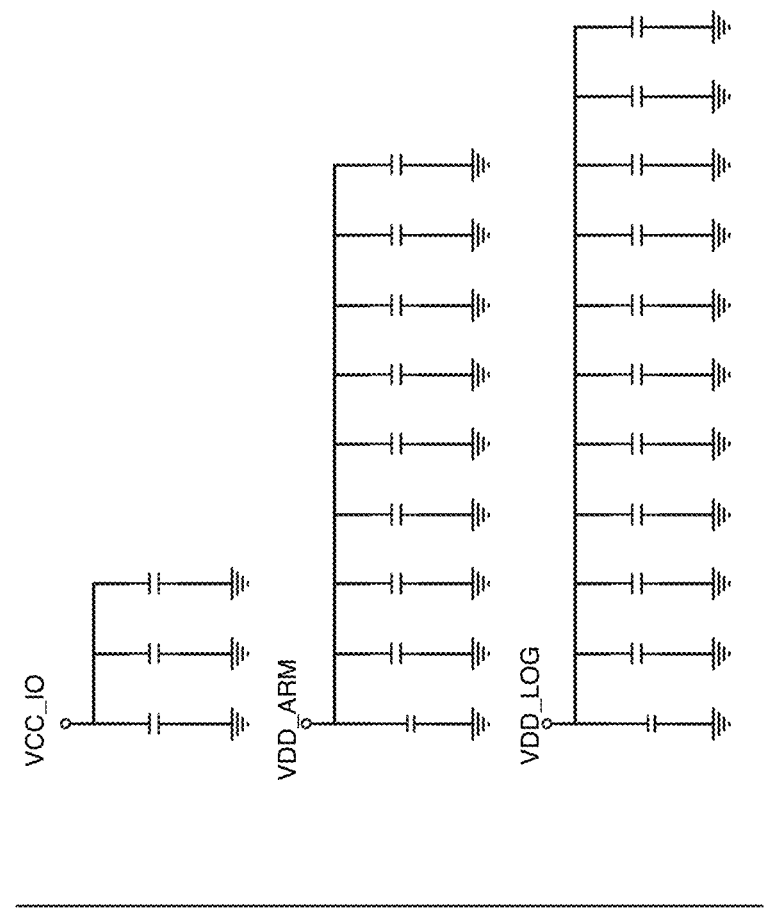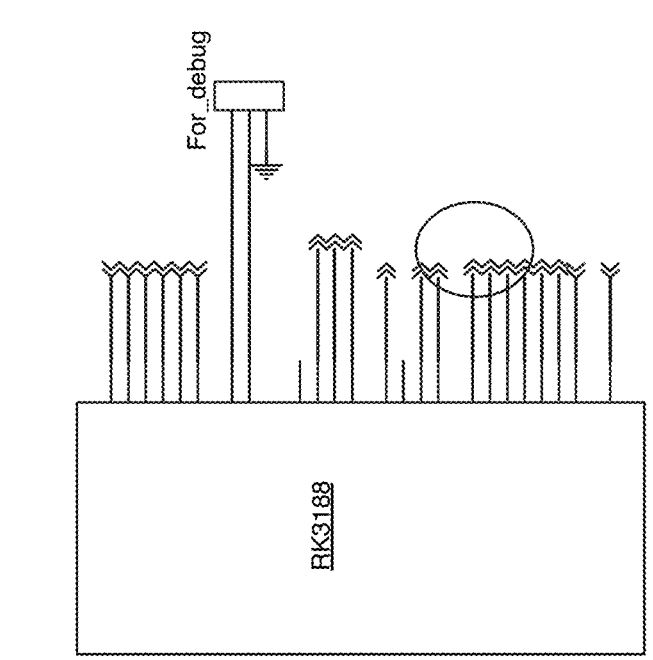
FIG. 18

HANDHELD PORTABLE HIGH FIDELITY MUSIC PLAYBACK WITH STREAMING AND WIFI ROUTING ABILITY

CROSS REFERENCE

Priority is claimed from the U.S. Provisional Patent Application No. 61/924,184 filed on Jan. 6, 2014 entitled "Handheld Portable High Fidelity Music Playback with Streaming and Wi-Fi Routing Ability", the entirety of which is hereby incorporated by reference.

BACKGROUND OF THE INVENTION

Field of the Invention

The present invention relates to a circuit design for a high fidelity music playback, more particularly, relates to a circuit design for a handheld portable high fidelity music processing and playback that is capable of forming a wireless routing network with various electronic devices and enabling seamless music and media streaming with the internet, 3G/4G networks and high fidelity lossless sound effect to cell phones, tablets, earphones, car sound systems, family entertainment centers and power speakers.

Description of the Related Art

Current portable computer systems do not have high sound quality playback capacity; cell phones or other hand held systems cannot process high fidelity music data, and the quality or sound effect of compressed audio data usually are not good enough for many music lovers. High fidelity sound systems are generally not portable and very expensive.

Many people do not ever dream about listening to high fidelity music, because they never think they are able to afford such a system. Common car drivers would not have dreamed of listening to high fidelity music unless they are able to afford an expensive car.

Technology illiterate or pre-school children, the un-educated, the illiterate, and people with old age and disabilities may not be able to enjoy the current high technology based music systems.

Accordingly, there is great need for an improved portable audio system that is easy to use even for technology ignorant consumers; and that can handle high density audio data and also plays back such audio data in high quality and lossless way.

ASPECTS AND SUMMARY OF THE INVENTION

This application discloses a circuit design for a handheld, portable Wi-Fi enabled High Fidelity music processing and playback device that decodes and encodes high density 24 bit media files, and provides with high fidelity amplifying circuit for lossless playbacks.

In one example embodiment, it is provided a built-in full format Lossless playback that connects with an Apple iOS or Android based cell phones or tablets with Wi-Fi communication to achieve 24 bit 192 k decoding and encoding and 600 mw of Hi-Fi audio amplification for cell phones and tablets.

In one example embodiment, the portable High Fidelity music processing and playback device employs a compact handheld design having a 6 layer PCB (Printed Circuit Board) stackup configuration that is cost effective in manufacturing as well as having improved signal integrity.

In one example embodiment, a traditional low-tech radio-like rotatable knob is utilized for user interactions for the controlling of the device, allowing the most technology ignorant users, pre-school children, the un-educated, the illiterate, and people with old age and disabilities to enjoy lossless music from the internet and 3G/4G network devices.

In one example embodiment, four pairs of differential operational amplification circuits are employed in combination of a Hi-Fi sound driver that achieves a +/−8-12 v, 600 mw, SNR>120 db maximum amplification output and lossless audio THD+N 0.0004% sound quality.

In one example embodiment, a 3.7 v-5 v high efficiency circuit lines are provided with 8 bit MCU (microcontroller) and 10 bit ADC (analog-to-digital converter), power management circuits, 5 v USB power charging circuits are provided with the portable media processing device.

It is provided portable audio processor with an Android based OLED interactive display interface that involves six interactive display module and their respective music menu.

The above and other aspects, features and advantages of the present invention will become apparent from the following description read in conjunction with the accompanying drawings, in which like reference numerals designate the same elements.

BRIEF DESCRIPTION OF THE DRAWINGS

FIGS. 2 and 3 are respectively a side view and a top view of an example portable audio processing and high fidelity playback device having a radio rotating knob and a touch-screen display that has been made and shown to work in accordance with this application.

FIG. 6-10 show detailed circuit diagrams for power controlling for an example portable audio processing and high fidelity playback device that has been made and shown to work in accordance to this application.

FIG. 11-20 show detailed circuit diagrams for data processing and storing of an example portable audio processing and high fidelity playback device that has been made and shown to work in accordance to this application.

DETAILED DESCRIPTION OF SAMPLE EMBODIMENTS

Figure 1:
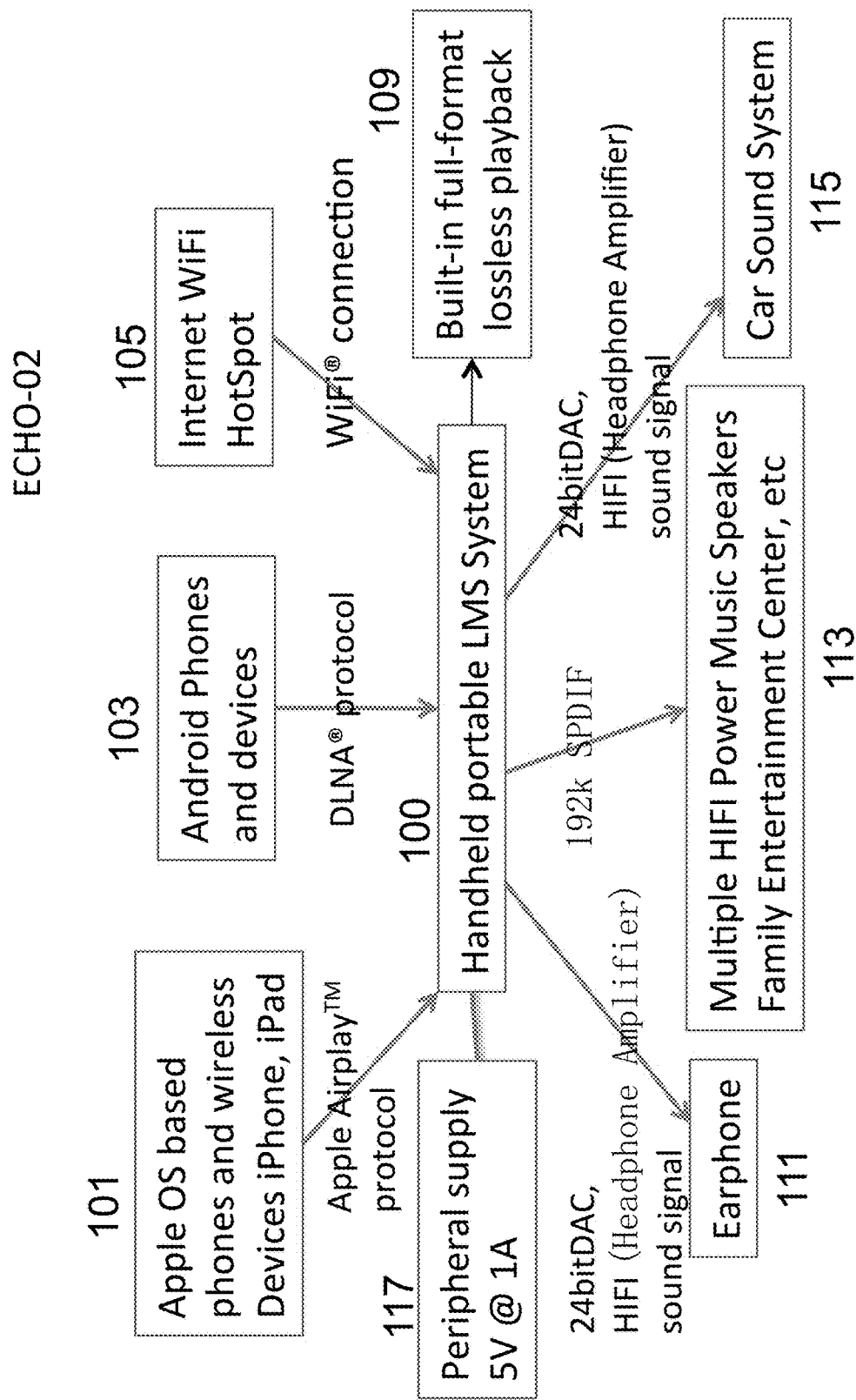
FIG. 1 is an example diagram of functional interactions between a portable audio processing system and various music sources and sound devices in accordance with this application.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

The terms "first," "second," "third," "fourth," and the like in the description and the claims, if any, may be used for distinguishing between similar elements and not necessarily for describing a particular sequential or chronological order. It is to be understood that the terms so used are interchangeable. Furthermore, the terms "comprise," "include," "have," and any variations thereof, are intended to cover non-exclusive inclusions, such that a process, method, article, apparatus, or composition that comprises a list of elements is not necessarily limited to those elements, but may include other elements not expressly listed or inherent to such process, method, article, apparatus, or composition.

The present invention may be described herein in terms of functional block components and various processing steps. It should be appreciated that such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more microprocessors or other control devices.

It should be appreciated that the particular implementations shown and described herein are illustrative of the invention and its best mode and are not intended to otherwise limit the scope of the present invention in any way. Furthermore, the connecting lines shown in the various figures contained herein are intended to represent exemplary functional relationships and/or physical couplings between the various elements. It should be noted that many alternative or additional functional relationships or physical connections may be present in a practical incentive system implemented in accordance with the invention.

Communications between device participants in the audio network system of the present invention is accomplished through any suitable communication means, such as, for example, a telephone network, public switch telephone network, intranet, Internet, extranet, WAN, LAN, WLAN, personal digital assistant, cellular phone, kiosk terminal, online communications, off-line communications, wireless communications, satellite communications, and/or the like. One skilled in the art will also appreciate that, for security reasons, any databases, systems, or components of the present invention may consist of any combination of databases or components at a single location or at multiple locations, wherein each database or system includes any of various suitable security features, such as firewalls, access codes, encryption, de-encryption, compression, decompression, and/or the like.

The present invention is described below with reference to block diagrams and flowchart illustrations of methods, apparatus (e.g., systems), computer program, electronic components, products according to various aspects of the invention. It will be understood that each functional block of the block diagrams and the flowchart illustrations, and combinations of functional blocks in the block diagrams and flowchart illustrations, respectively, can be implemented by computer program instructions and in electronic circuits according to their respective needs in the field of art. These computer program instructions may be loaded onto a general purpose computer, special purpose computer, or other programmable data processing apparatus to produce a machine, such that the instructions which execute on the computer or other programmable data processing apparatus create means for implementing the functions specified in the flowchart block or blocks.

"Process" term in this application means coming up with a solution to functions, and a program, logic code or instructions for the solution.

Accordingly, functional blocks of the block diagrams and flowchart illustrations are the Components that support combinations of means for performing the specified functions, combinations of steps for performing the specified functions, and program instruction means for performing the specified functions. It will also be understood that each functional block of the block diagrams and flowchart illustrations, and combinations of functional blocks in the block diagrams and flowchart illustrations, can be implemented by either special purpose, hardware-based computer systems which perform the specified functions or steps, or suitable combinations of special purpose hardware and computer instructions.

The term "internal noise" refers to undesired sound that is generated when electrically powered equipment radiates un-programmed radiofrequency and or audio-range signals as a result of electromagnetic fields that are an incidental and unwanted byproduct of the circuit design's own in-line electronics. The electronics generating internal noise may be intrinsic.

The term "nonlinear amplitude response" refers to electronic amplification that varies in a disproportional way as the actual amplitude changes during a performance. The terms "binary audio intensity" and "coded sound intensity" refer to the amplitude of sound as encoded in an audio digital stream.

The term "dynamic sound range" refers to the extent of difference between the loudest possible sounds and quietest possible sounds that are conveyed when a performance is recorded or when it is amplified for an audience.

The term "audio frequency response" refers to the relative uniformity of electronic reproduction of amplitudes across a frequency spectrum. The term is used when input amplitudes as actually produced by a performance are compared to output amplitudes from electronic equipment that amplify and or record the performance.

Inhomogeneous propagation of magnitudes across frequency spectra are sometimes accompanied by phase changes (measured in radians) in the analog signal, and these may also differ depending on the frequency. Common sources of non-homogeneity are electronic amplifiers, microphones and loudspeakers. Common sources of the phase shifts are capacitive reactance or inductive reactance in circuit components.

The term "audio frequency band" refers to a subset of audible frequency spectrum. The term "incremental audio frequency band" refers to a narrow range within the audible frequency spectrum.

The term "in electrical communication" as used in respect to two electrical components refers to their mutual presence on the same circuit, wherein one or both components is able to receive electrical current that has passed through the other.

The term "transmitter control interface" (TCI) refers to an interface that is programmed with stored instructions by means of a microcontroller unit (MCU), and that is in electrical communication with one or more of an audio digital encoder, a DSP, a FPGA encoder, and a wireless transmitter. In certain illustrative, non-limiting embodiments the TCI comprises a serial peripheral interface (SPI). In alternative illustrative, non-limiting embodiments the TCI comprises an inter-integrated circuit (I2C).

The term "programming" refers to providing instructions to a component or to a circuit subset. The term programming includes but is not limited to: programming of settings by a user, such as for the settings of a microcontroller; programming of other electronic components in a circuit by a microcontroller located on that circuit; and the like. The term "control" refers to management of electrical or electronic signals by monitoring them, routing them, switching electronic components on or off, modifying attributes of the signals, or the like.

The term "programmed delay" refers to delaying an electrical or electronic signal so that its end-to-end time in passing through a circuit falls within a preferred range. The programmed delay may be achieved by cycling the signal through data registers in a repetitive fashion (i.e., in a reiterative loop) or by other means.

The term "configured" as used herein with respect to a respective electronic component refers to a combination of factory settings for the respective component, user-adjusted settings for the component or a controller driving it, and inter-circuit relationships for electrical communication between the respective component and other hard-wired electronic components.

The term "encoder" refers to a component that is capable of transforming analog audio signals into digital signals, or vice versa, optionally under the control of stored instructions from a microcontroller. The terms "audio digital stream" and "sampled audio digital stream" refer to electrical signals arising from the digitization of analog electrical signals.

The term "digital signal processor" (DSP) refers to a component that is capable of editing digital signals, optionally under the control of stored instructions from a microcontroller. By editing is meant that suitable digital signal processors are capable of deleting, amending, adding to, coding, decoding, compressing and decompressing digital signals.

The term "FPGA encoder" refers to a field programmable gate array that adds information to a digital electrical signal to prepare it for wireless transmission. The term "formatting for wireless transmission" refers to that addition of information for such a purpose.

The term "wireless" as used herein with respect to transmissions of signals along an over-the-air-path refers to wireless telecommunications. Wireless transmission modalities contemplated by the invention include but are not limited to radiofrequency transmissions, infrared transmissions, visual optical transmissions, microwave transmissions, and ultrasonic transmissions.

The term "in wireless communication" refers to the passage of wireless signals along an over-the-air-path between a first circuit having a wireless transmitter and a second circuit having a wireless receiver. The term "wireless transmitter" refers to a transmitter for a wireless modality. The term "wireless receiver" refers to a receiver for a wireless modality. In some embodiments of the invention wireless communications may be transmitted in both directions: in that case when wireless signals are sent in the reverse direction the receiver functions as a transmitter and vice versa.

The term "over-the-air path" refers to a transmission path through a medium such as air, along which wireless communications may be transmitted.

The term "digital audio CODEC" refers to an algorithm or component that can encode information from an analog audio signal as digital electrical signals, and or that can decode a digital electrical signal to prepare it for transformation to an analog waveform. In some embodiments it contains both an ADC and a DAC running off the same clock, as in a sound card.

The term "external audio apparatus" refers to a device for playing or processing sound from a musical performance. As used herein the term includes but is not limited to amplifiers, mixing boards, loud speakers, head phones, recording devices, other engineering devices for sound quality adjustment, and the like.

The term "external audio cable" refers to an audio cable between an audio connector and external transmitter unit.

The term "transmitter unit" is synonymous with wireless transmitter.

The term "receiver" is synonymous with wireless receiver.

The term "high fidelity reception" as used herein refers to wireless reception of an encoded digital audio signal in a manner that is sufficiently complete and predictable that the signal can be decoded and transformed to faithfully reproduce audible sound from its original source.

The term "audio processor" refers to a device having one or more functions such as amplifying sound, recording a performance, modifying digital signals for music, or the like.

The term "receiver unit" refers to a circuit comprising a receiver and an audio processor.

The term "host" and "slave" role refers to that when two devices are in communication they form a link, whichever device controls that link is called the master or host, while the other is called the slave or peripheral.

An illustrative portable electronic device in accordance with an embodiment of the present invention is shown in FIG. 1-3. Portable electronic devices such as illustrative portable electronic device 100 may be laptop computers or small portable computers such as those sometimes referred to as ultra-portables. Portable electronic devices may also be somewhat smaller devices. Examples of smaller portable electronic devices include wrist-watch devices, pendant devices, headphone and earpiece devices, and other wearable and miniature devices.

The use of handheld devices is therefore generally described herein as an example, although any suitable electronic device may be used with the functions and circuit design of the present invention, if desired.

Audio equipment refers to those devices that are able to reproduce frequencies high enough and low enough to the human hearing range, about 20 Hz to 20,000 Hz. CDs are capable of reproducing frequencies as low as 10 Hz and as high as 22.05 kHz, making them adequate for reproducing the frequency range that most humans can hear.

"High-resolution" audio refers to audio that has a higher sampling frequency and bit depth than CD, which is 16-bit/44.1 kHz. High-resolution audio files usually use a sampling frequency 96 kHz or 192 kHz at 24-bit. Sampling frequency means the number of times samples are taken per second when the analogue sound waves are converted into digital. The more bits there are, the more accurately the signal can be measured, so from 16-bit to 24-bit there can see a noticeable leap in quality. The highest quality MP3 has a bitrate of 320 kbps, whereas a 24-bit/192 kHz file is transferred at a rate of 9216 kbps. Music CDs are transferred at 1411 kbps. 24-bit/192 kHz files therefore more closely replicate the sound quality that the musicians and engineers were working with in the studio.

A 24 bit 192 kHz formatted music is thus a music of high resolution that is more capable of being played back with high fidelity. High fidelity audio equipment refers to those devices that provide no noticeable distortion of the signal or emphasis or de-emphasis of any frequency in this frequency range. Since the highest sound resolutions of current cells phones and handheld audio processing devices can only decode audio files mostly around 16-bit/44 kHz, the music playback from these devices are not satisfactory.

"High-Fidelity" audio playback device in this application means a device that can produce "Lossless" audio with minimal distortion of the signal, that is capable of reproducing the full range of sound from recordings that have been mastered from better than 16-bit/44.1 kHz (CD quality) music sources.

High-resolution audio file encoding includes FLAC (Free Lossless Audio Codec) and ALAC (Apple Lossless Audio Codec), both of which are compressed but in a way that no information is lost. Other formats include WAV, AIFF and DSD, the format used for Super Audio CDs. It is contemplated that the described invention and diagrams can be used to execute any suitable operating platforms, including Apple OS, Android, Windows, Firefox, Linux, mobile platforms, and any other software platforms, standard or custom-made, open source or proprietary, virtual or non-virtual, that are currently available or become available in the future.

It is contemplated that both the PCM and the DSD uncompressed audio data formats are supported (definitions are in compliance to the ones used in audio processing field).

In reference to FIG. 1, a portable high fidelity audio processing device 100 that may be installed with an Android based operating system. Its control center can interact with a variety of devices, 3G/4G networks and the Internet through Wi-Fi communication. System 100 receives and transmits Wi-Fi signals to and from the various data source devices through controlling the its Wi-Fi compliant antenna. The devices include such as Apple OS based phones, iPad 101, Android based phones and tablets 103, internet Hotspot or a computer 105. Once a Wi-Fi signal is received, device 100 registers the sending device in its Wi-Fi network database. The connections to the various Wi-Fi enabled devices may be established simultaneously or one device at a time at a user's command. User input commands on device 100 are converted into Wi-Fi signals and transmitted to the various devices where the Wi-Fi connections are established.

Based on the received Wi-Fi signals and the metadata of data packets, system and device 100 determines which compliant decoding or encoding protocol to use to process the incoming data streams. The decoded data packets are then formatted either according to the 24 bit PCM of DAC protocol (for example for an earphone 111 or built-in playback 109 or car sound system 115) or S/PDIF protocol (e.g. for a HiFi music speaker 113) to be played back according the user command. The formatted audio data are then amplified through a built-in high fidelity playback amplifying circuit, to be sent to a sound system for playback. Portable audio processing device 100 may also include a peripheral USB changer capacity 117. This USB charger can be a convenient power supply for high fidelity earphones and other devices.

In reference to FIGS. 2 and 3, an example handheld portable high fidelity audio processing device 200 in a shape of a regular bottle like box is shown. Device 200 includes both a traditional low-tech radio rotating knob mechanism 201 as well as a touch screen 203 to allow user interactions through simple and intuitive mechanical actions. Radio like rotating knob mechanism 201 may have a push and lock mechanism for power switches. Rotating of the knob is coupled to volume control and channel selections and other user commands.

The combination of touch screen 203 and rotating knob mechanism 201 allows the most technology illiterate users, pre-school children, the un-educated, people with old age and disabilities to interact with high fidelity internet music with ease and elegance. Two plugin sockets 205 for earphones and external sound systems are provided on the top in the example. Other buttons, user input control devices, and other input-output components, other input-output jack similar to plugin ports 205 may also be included.

Handheld device 200 may have ports such as bus connector and jack that allow device 200 to interface with external components. Typical ports include power jacks to recharge a battery within device 200 or to operate device 200 from a direct current (DC) power supply, data ports to exchange data with external components such as a personal computer or peripheral, audio-visual jacks to drive headphones, a monitor, or other external audio-video equipment, etc. The functions of some or all of these devices and the internal circuitry of handheld electronic device can be controlled using input interface 201 and/or 203.

Suppressing the noise at the source makes sense for building a music playback. The multilayer PCB stackup configuration is thus one of the important aspects in achieving the best possible performance of a product. A poorly designed substrate with inappropriately selected materials, can degrade the electrical performance of signal transmission increasing emissions and crosstalk and can also make the product more susceptible to external noise. In contrast, a properly built PCB substrate can effectively reduce electromagnetic emissions, crosstalk and improve the signal integrity providing a low inductance power distribution network.

Figure 4:
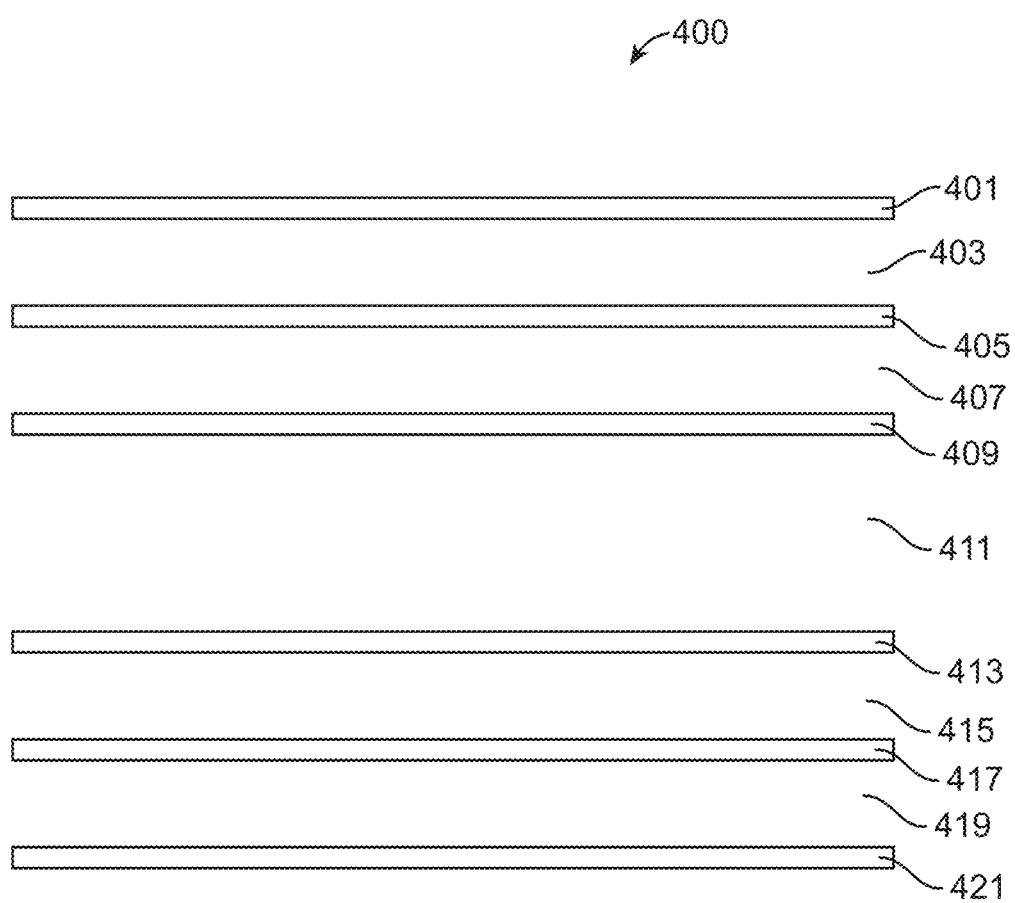
FIG. 4 is an example 6 layer PCB stackup configuration for a portable audio processing and high fidelity playback device that has been made and shown to work in accordance to this application.

In reference to FIG. 4, a 6 layer PCB stack design is shown. From top to bottom are top signal layer 401, a layer of 4.0 MIL prepreg fibreglass epoxy resin insulating material 403, 35 μm ground plane 405, a layer of 3.94 MIL dielectric material 407, a 35 μm power plane 409, another layer of prepreg fibreglass epoxy resin insulating material 411, a 35 μm signal layer 413, a layer of 3.94 MIL dielectric material

415, a 35 µm ground plane 417, a layer of 4.0 MIL prepreg fibreglass epoxy resin insulting material 419, and a bottom signal layer 421. Top layer 401 and bottom layer 421 respectively have a Hoz (18 µm) thickness with a copper plating.

Figure 5:
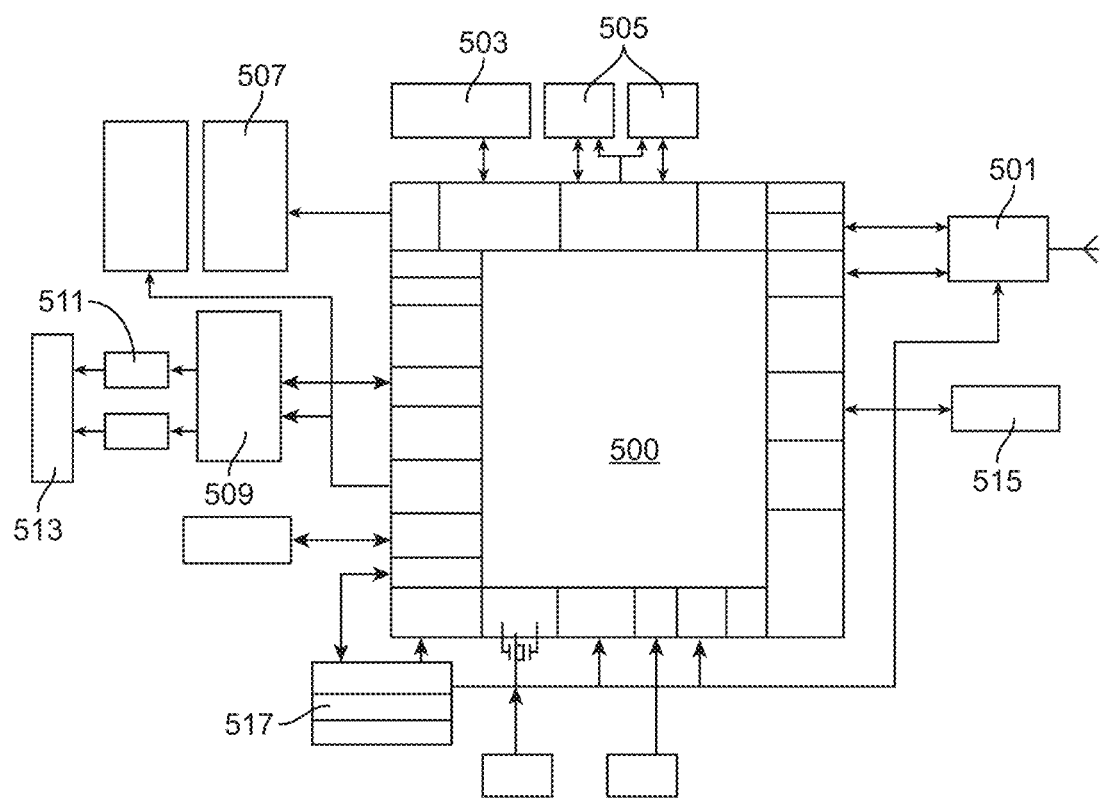
FIG. 5 is a block diagram illustrating of an electronic circuit configuration of a portable audio processing and high fidelity playback device in an in accordance with this application.
Figure 6:
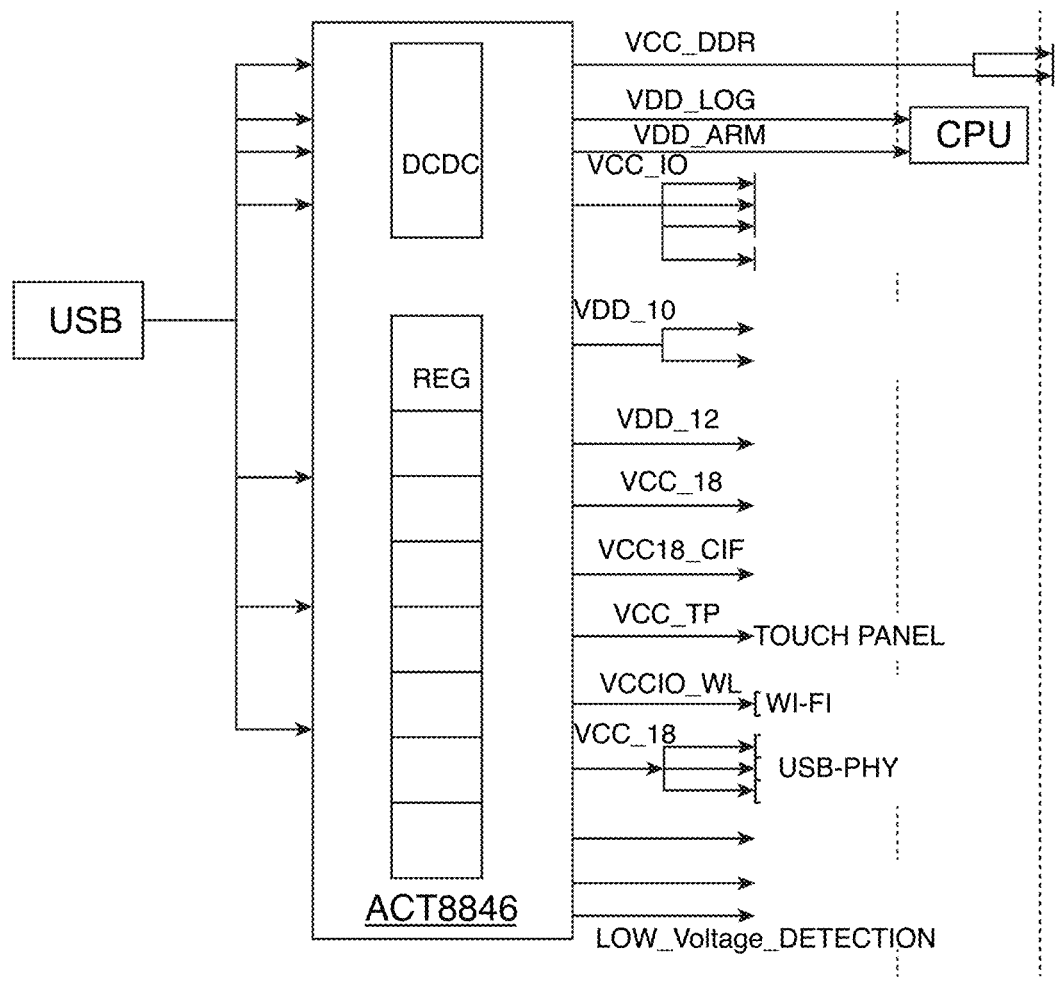
Figure 7:
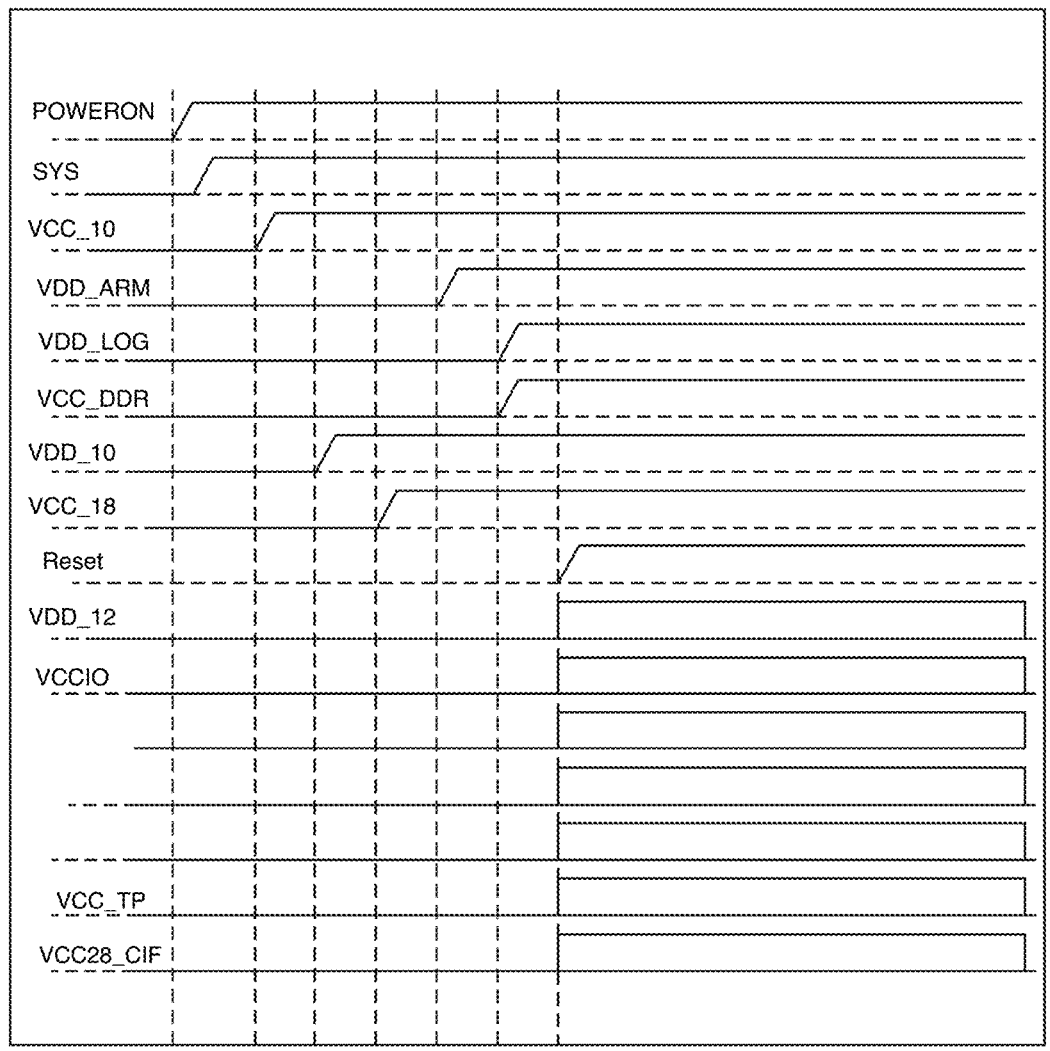
Figure 8:
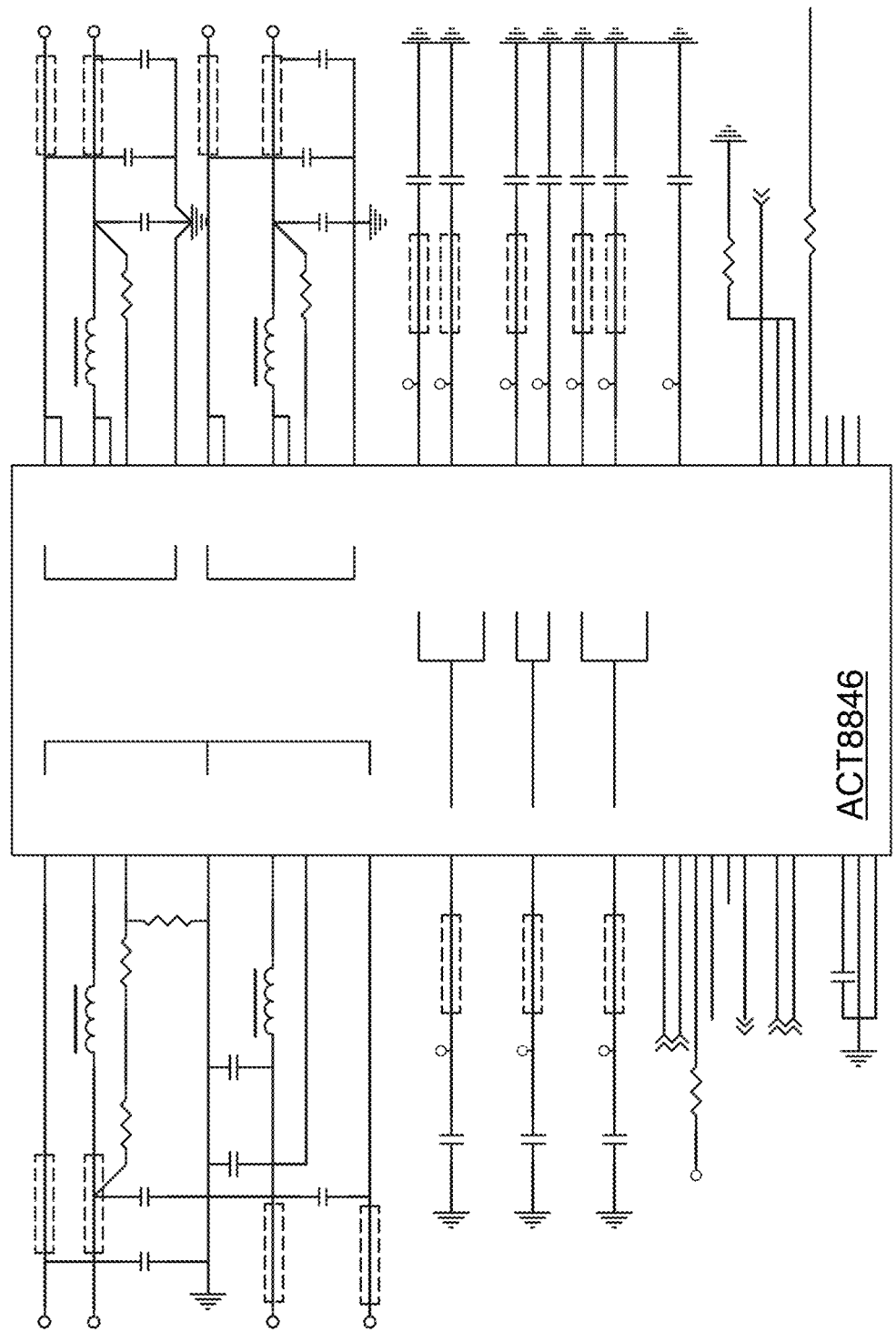

In reference to FIG. 5, in the broad scheme of circuit designs, electrical communication module circuit 501 is in communication with a stream of audio data in which the electrical signal has been processed and encoded and then transmitted as corresponding wireless signals on a path over the air to a data processing center circuit 500. After the wireless signal is received, it is stored in memory and/or flash memory module circuits 505, 503 and in turn is decoded and processed in the processing module 500, converted to analog format in digital to analog converter circuit 509, where the analog signal is properly amplified in high fidelity in amplification circuit 513 and play out in a sound system. Other modules may include power management integration circuit 517 and display module circuit 507, USB host and USB OTG (On-The-Go) circuit 515 that allows for switching back and forth between the roles of host and client devices so that the device can perform both the master and slave roles in communicating with other devices.

Figure 10:
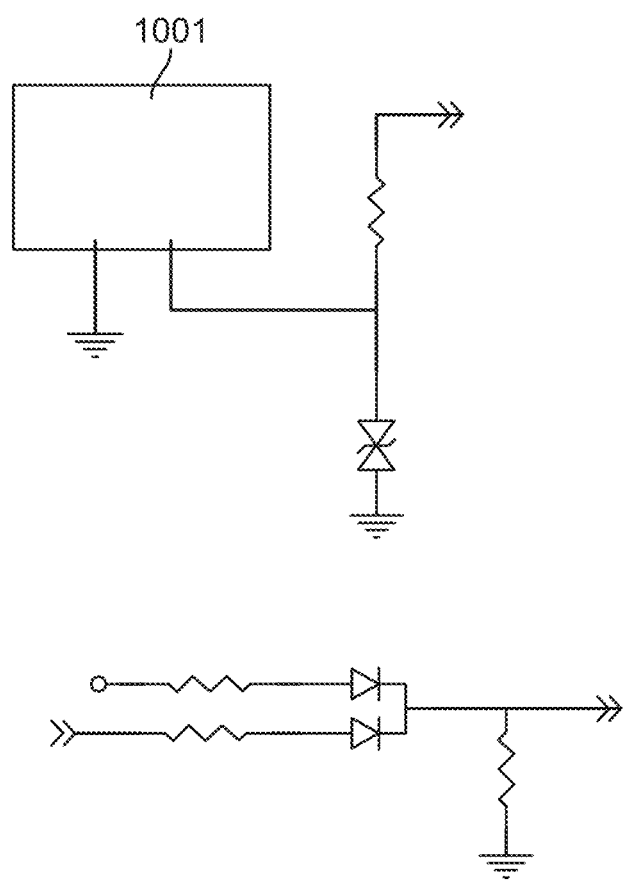
Figure 11:
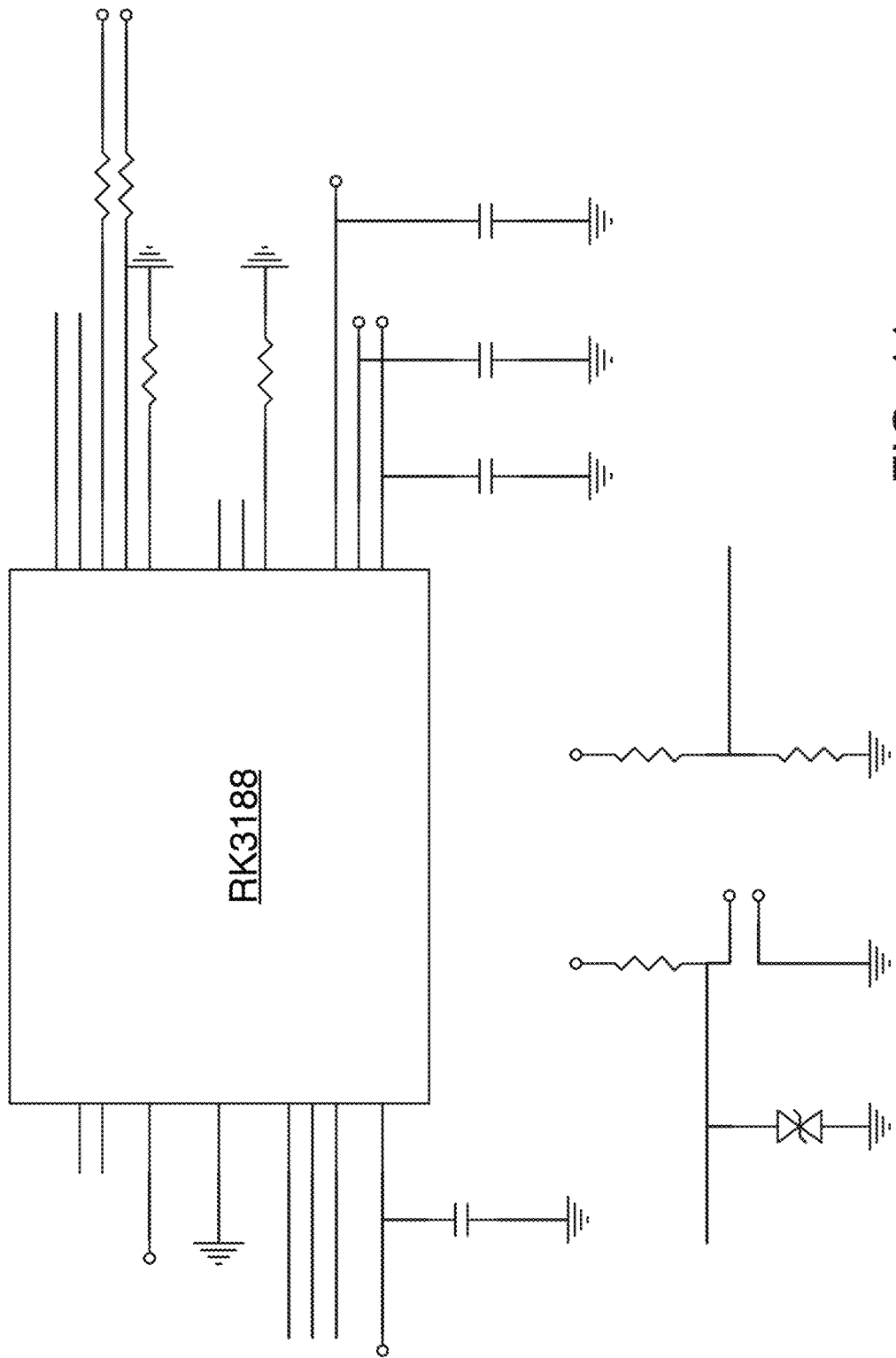
Figure 12:
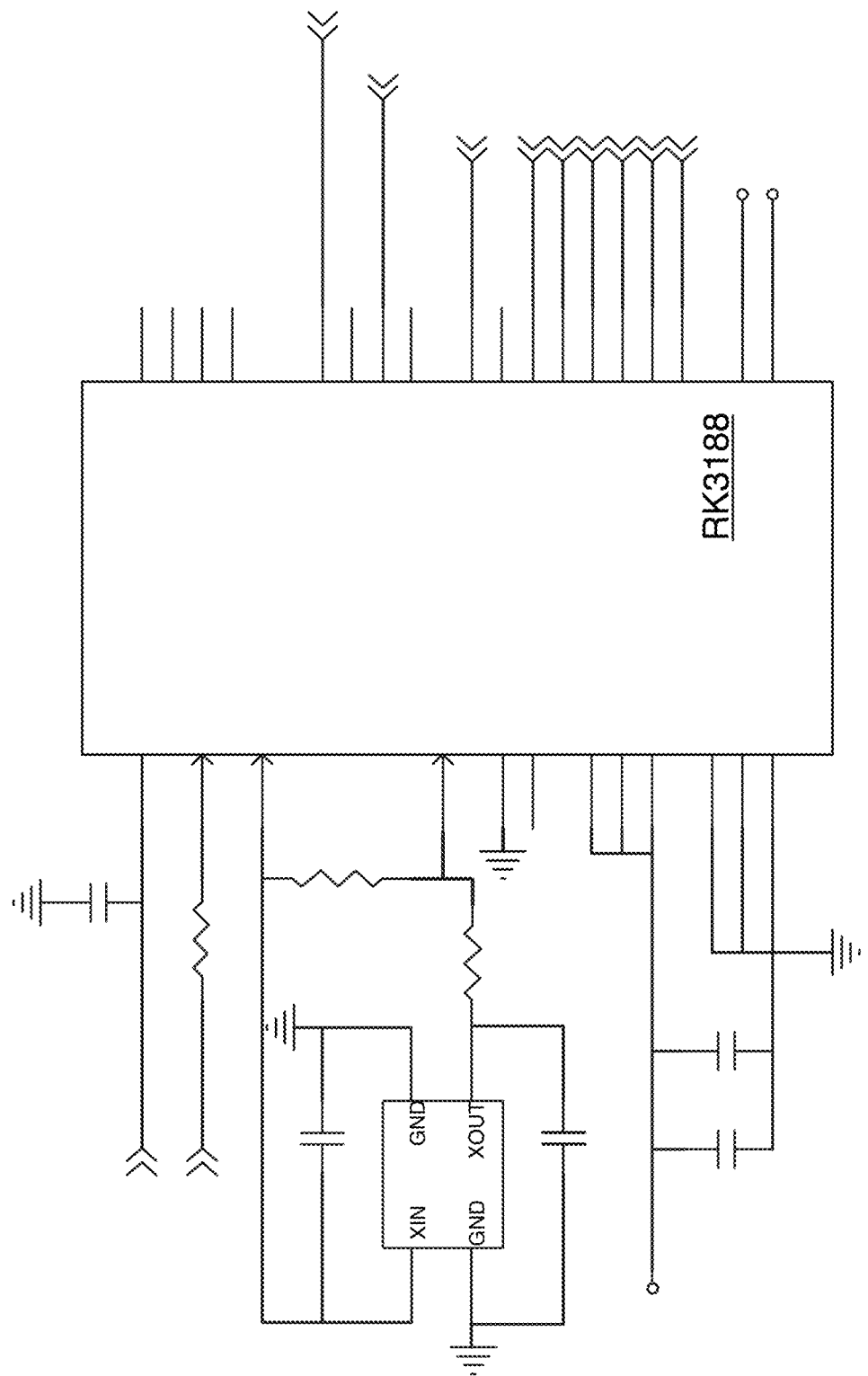
Figure 13:
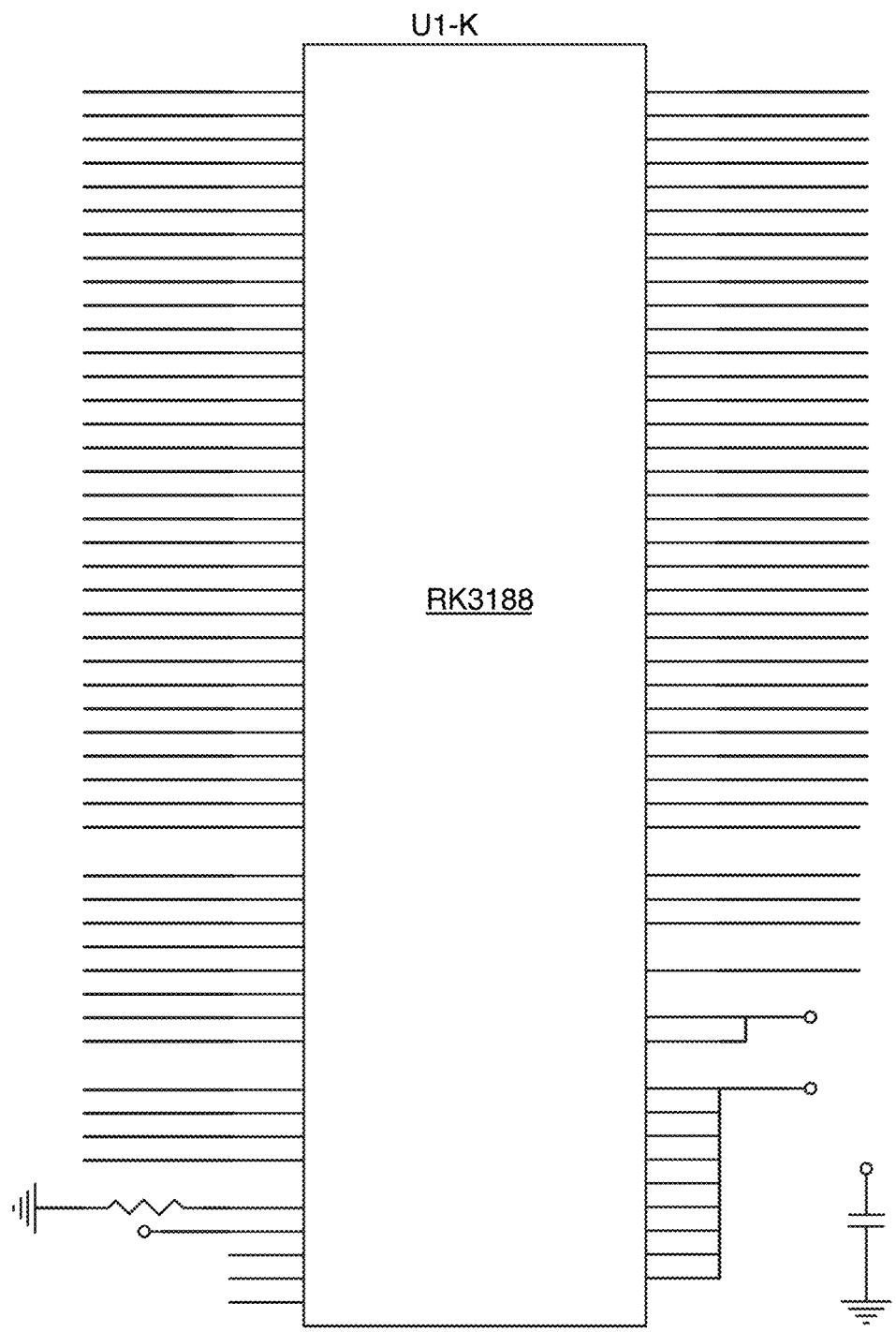
Figure 14:
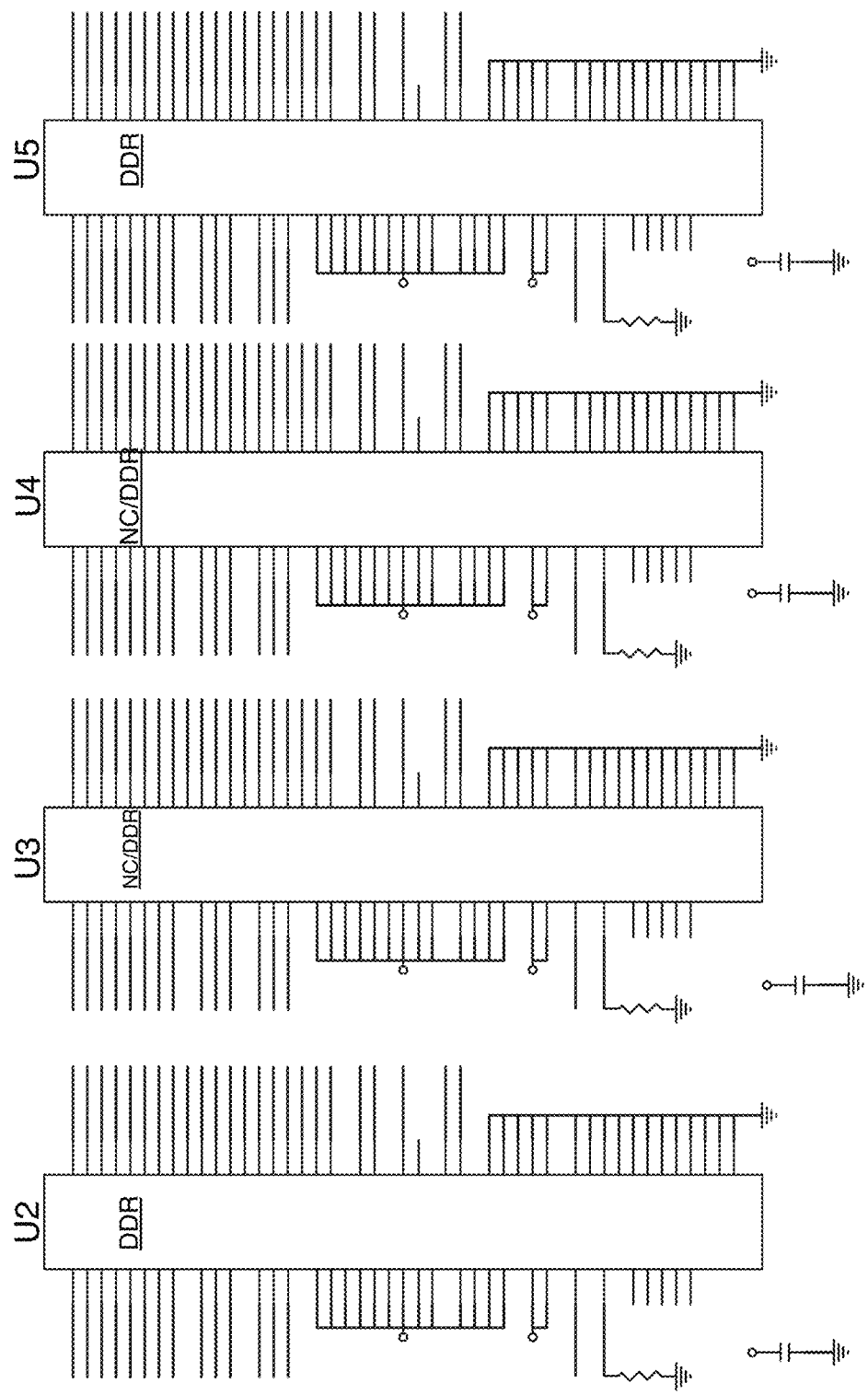
Figure 15:
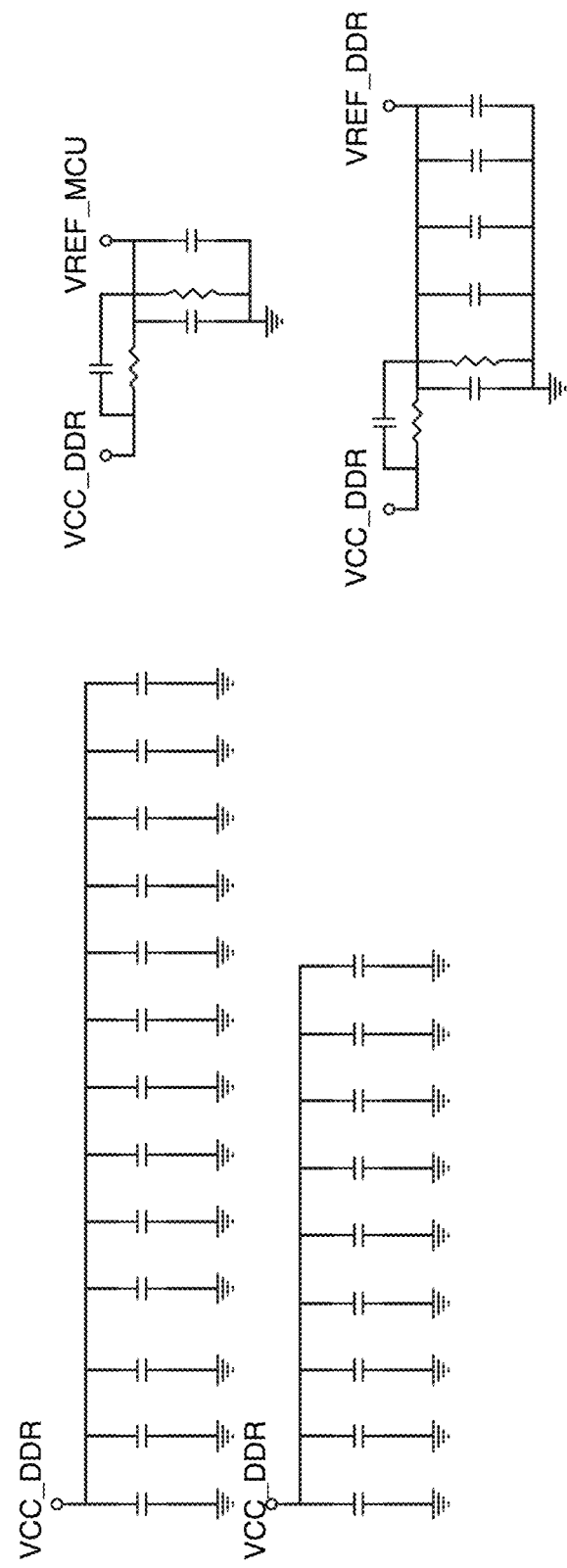
Figure 16:
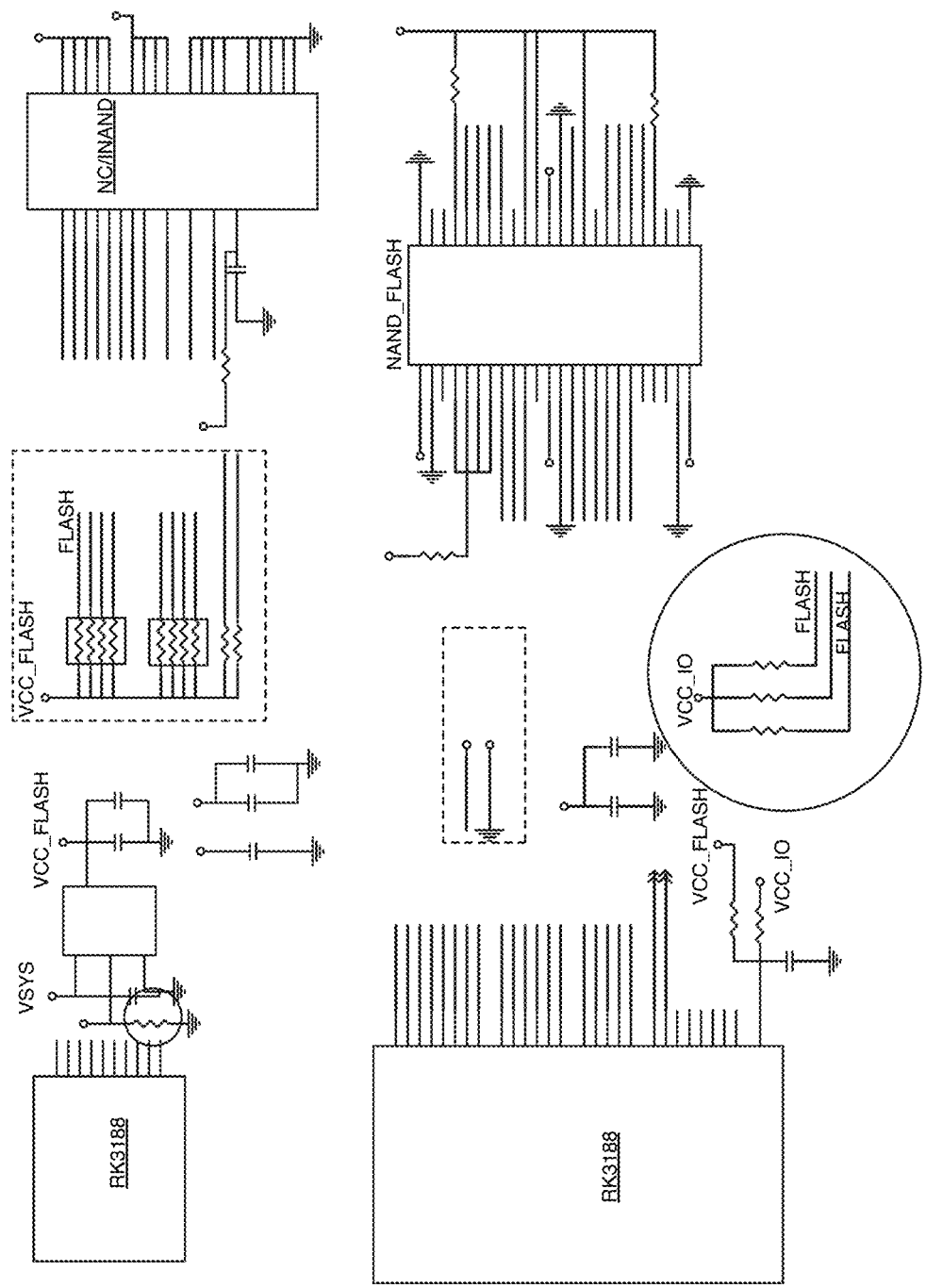
Figure 17:
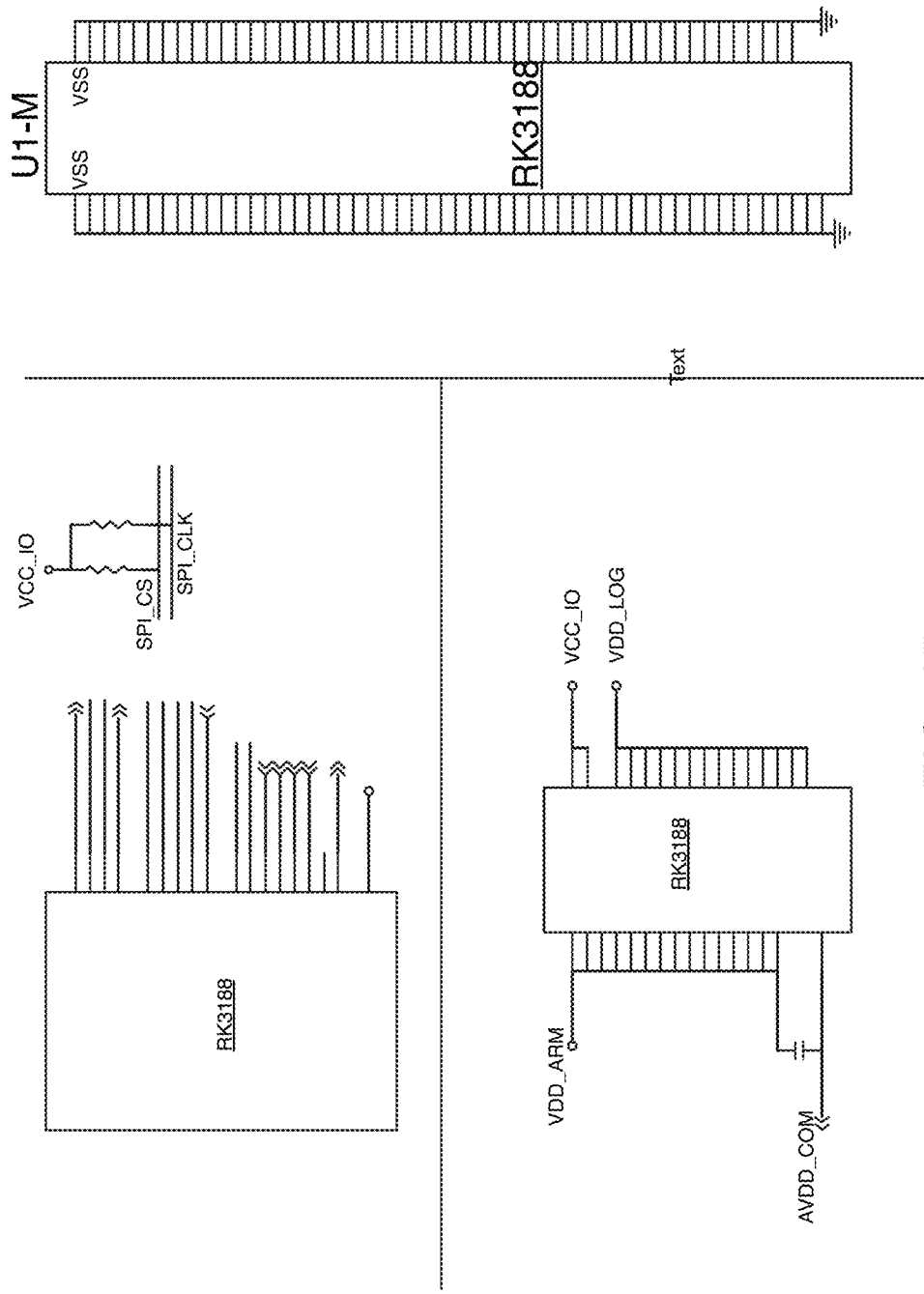
Figure 19:
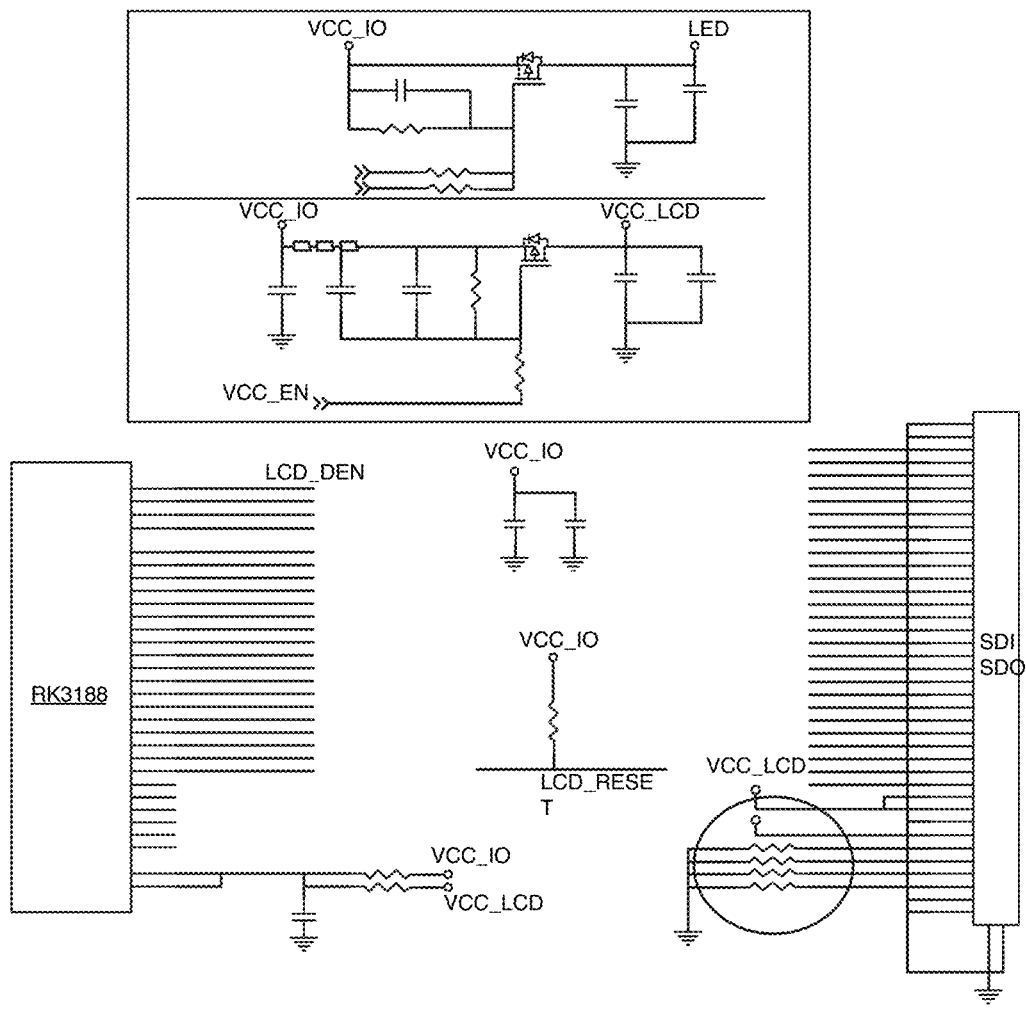
Figure 20:
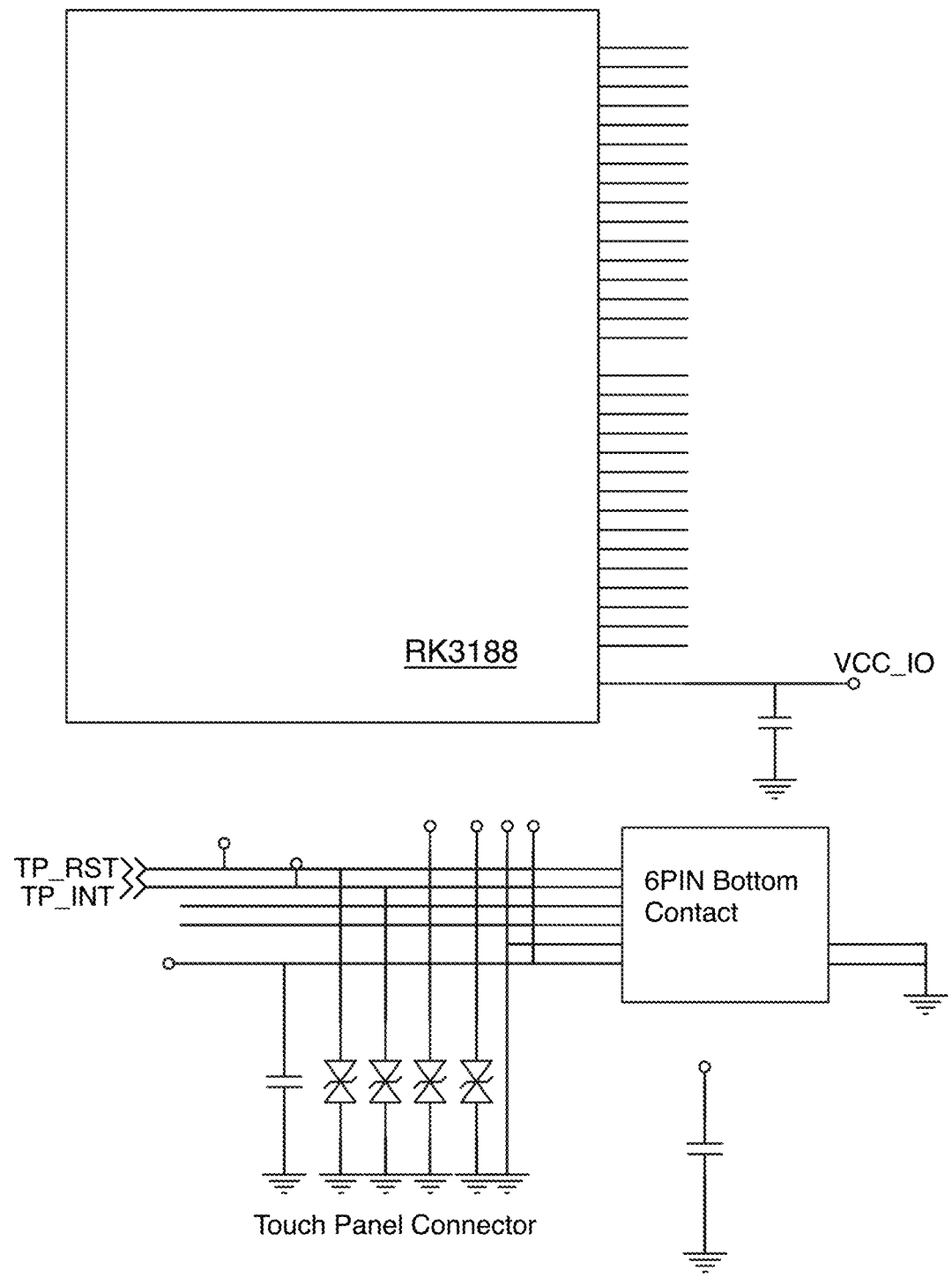

To be able to process 24-bit/192 kHz high resolution audio file, data processing center 500 needs to be configured with high processing capacity micro-processors, such as ARM Cortex A9 multi-core processors, for example, quad-core processor Mali-400 Rockchip's RK 3188. FIGS. 6, 7, 8 and 9 illustrate an example power management integration circuit 517 with chip ACT8846 designed by Active-Semi, Inc so that the power supply to each electronic module is accurately and carefully regulated. Power Key circuit 1001 in FIG. 10 is linked with a button PCB board for turning system on and off with the press of the knob button.

FIG. 11-20 show detailed circuit diagrams using RK 3188 chip for data processing and storing of a 24-bit/192 kHz high resolution audio file, accessing to and from flash memory and DDR memory drives and addresses. For these set of circuits function as a digital audio CODEC having algorithms for both decoding received digital data packets in either Apple's AIRPLAY format or DLNA (the Digital Living Network Alliance) format, and encoding digital data packets to communicate with other music playback devices in either Apple's AIRPLAY format or DLNA (the Digital Living Network Alliance) format.

Figure 21:
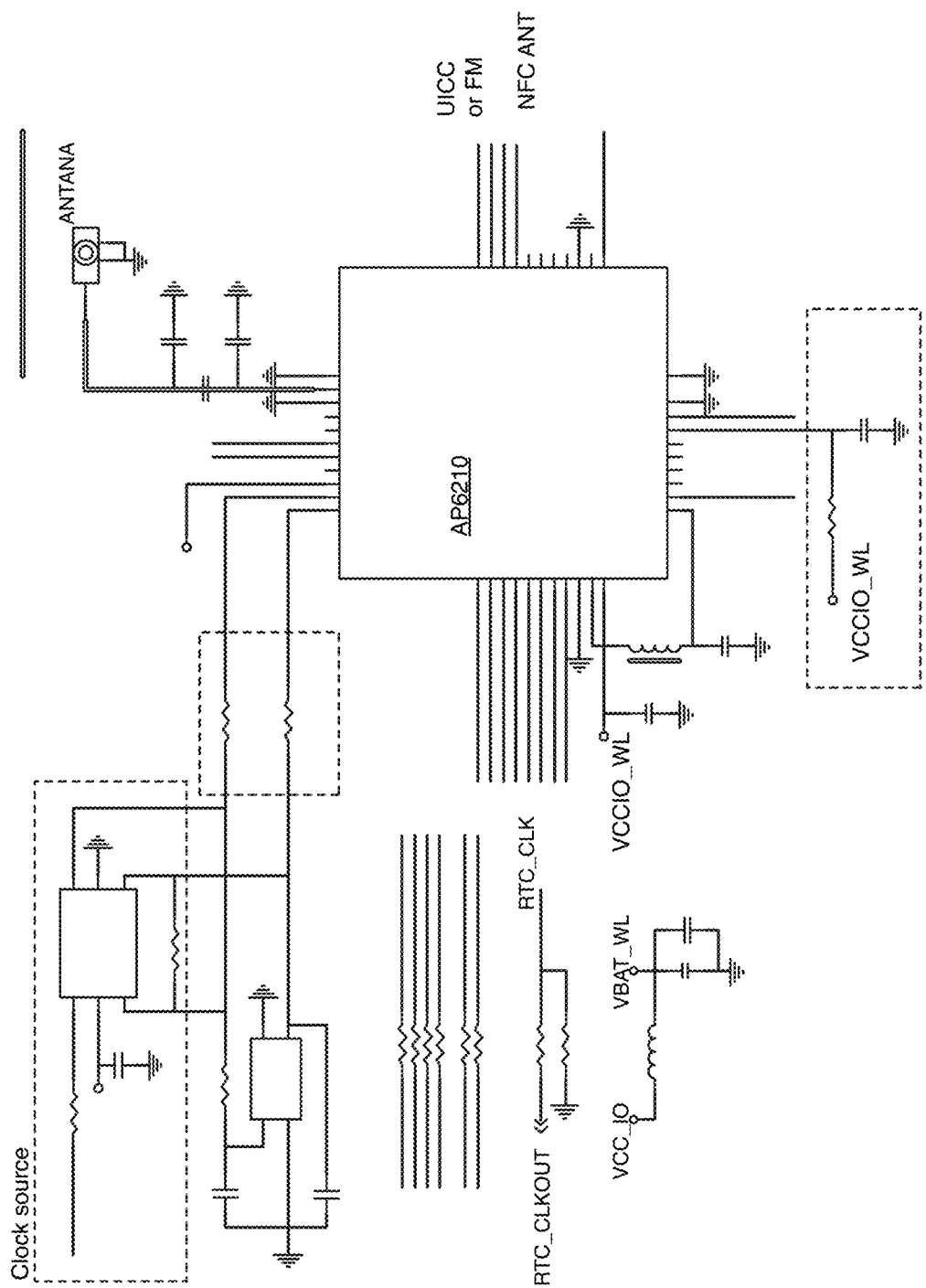
FIG. 21 shows detailed circuit diagrams for wireless communications for portable audio processing and high fidelity playback device that has been made and shown to work in accordance to this application.

FIG. 21 shows detailed circuit diagrams for Wi-Fi and/or Bluetooth wireless communications with chip set AP6210, AP6180 and AP6330 for high fidelity reception and transmission, functioning as a FPGA encoder.

Figure 22:
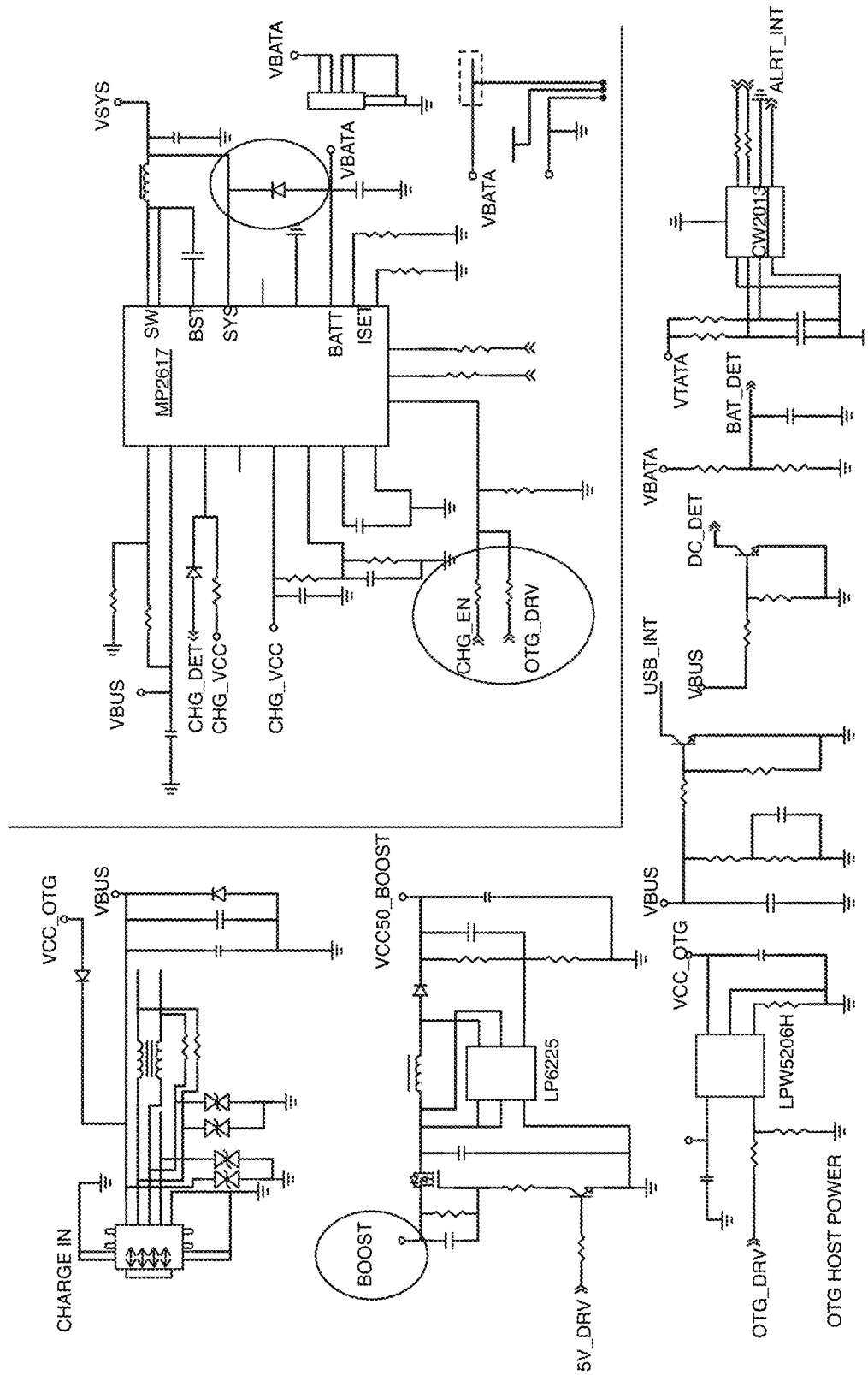
FIG. 22 shows detailed circuit diagrams for providing a 5 v USB charger on a portable audio processing and high fidelity playback device that has been made and shown to work in accordance to this application.

FIG. 22 shows detailed circuit diagrams for providing a 5V USB charger on a portable playback device. A 3.7 v-5 v high efficiency circuit lines are provided with 8 bit MCU (microcontroller) and 10 bit ADC (analog-to-digital converter) and power management circuits, 5 v USB power charging circuits are provided with the portable media processing device.

Figure 23:
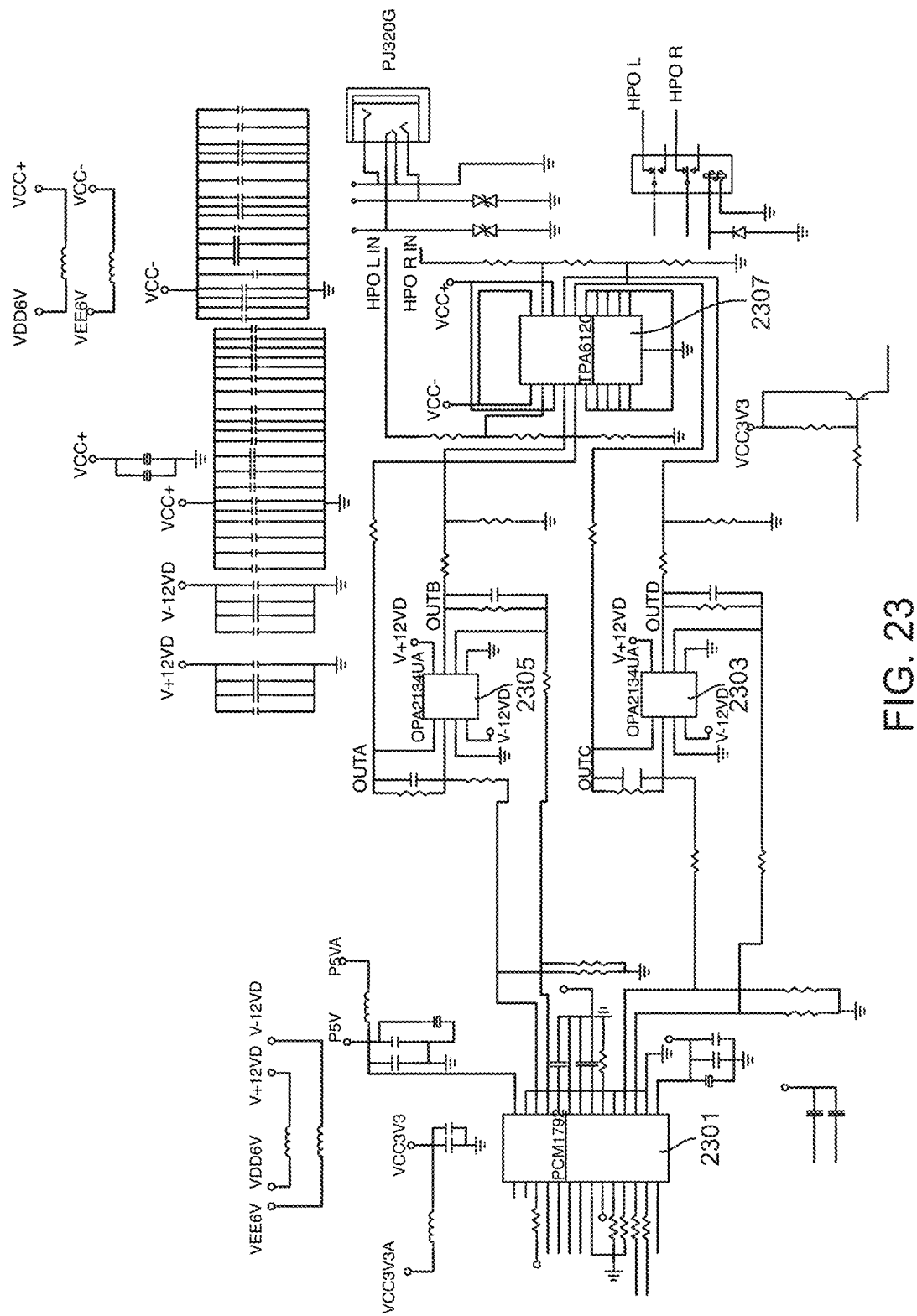
FIG. 23 shows detailed circuit diagrams for a high output and high fidelity audio amplification of a portable audio processing and high fidelity playback device that has been made and shown to work in accordance to this application.

FIG. 23 shows a detailed circuit diagrams for high output and high fidelity audio amplification that includes at least two differential operational amplification circuits. Digital 24 bit/192 k audio data are received through the Wi-Fi modules 501 in FIG. 5 in either Apple's AIRPLAY format or DLNA (the Digital Living Network Alliance) format, or both formats simultaneously. The data files are then decoded and reformatted into PCM (pulse-code modulation audio format standard, I2S and left justified) data files. The reformatted data signals are inputted into the PCM1792 digital-to-analog converter 2301 to convert into analog signals. The output analog signals are diverted into at least two differential operational OPT2134 amplification circuits 2303 and 2305 that are connected with filter circuits, the amplified analog signals are input into a Hi-Fi headphone driver TPA6120A2 chip 2307 to be played in an earphone or other sound system.

Figure 24:
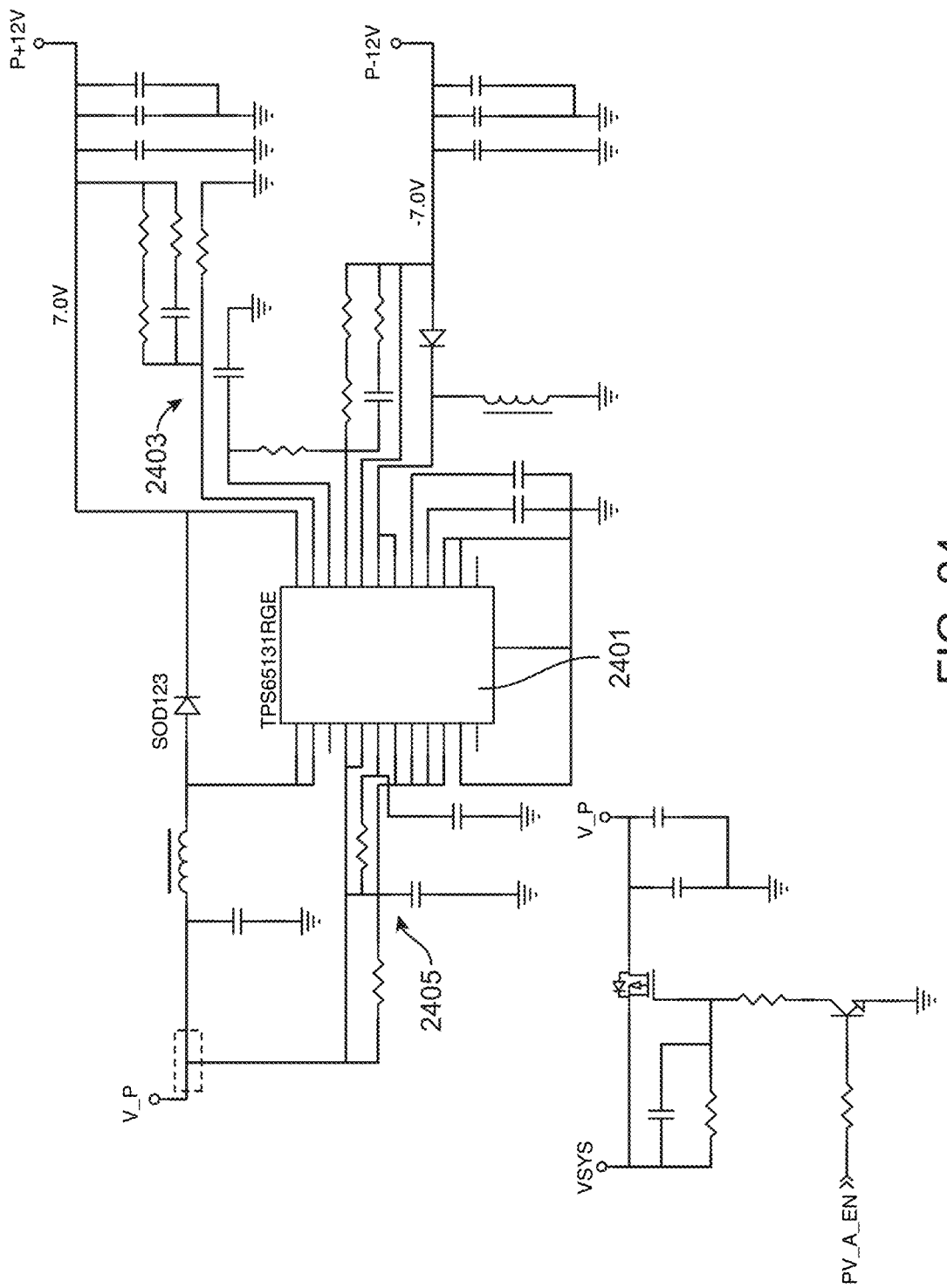
FIG. 24 shows detailed circuit diagrams for power management integration circuit to the high fidelity amplification circuit of FIG. 23 of an example portable audio processing and high fidelity playback device that has been made and shown to work in accordance to this application.
Figure 25:
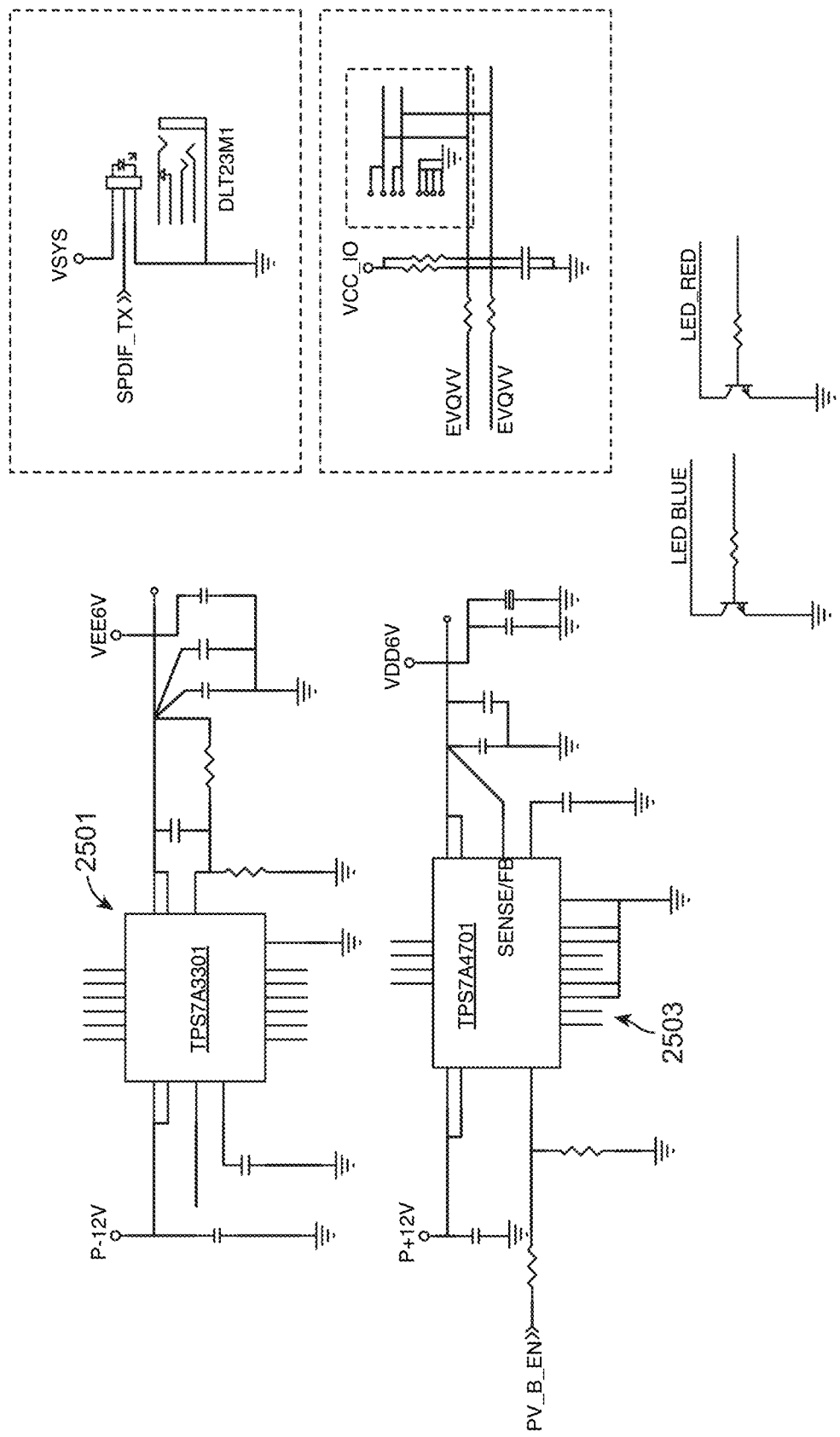
FIG. 25 shows detailed circuit diagrams for low-noise linear regulator for the power management integration circuit of FIG. 24 of an example portable audio processing and high fidelity playback device that has been made and shown to work in accordance to this application.

FIG. 24 shows detailed circuit diagrams for power supply to the high fidelity amplification circuit of FIG. 23. Dual output power supply 2401 chip TPS6513 is used to provide a power supply of +/−7V to +12/−12V in connection with multiple filters circuits 2403 and 2405 at both the input and output side to stabilize the power supply output. A high efficiency circuit lines are provided with 8 bit MCU (microcontroller) and 10 bit ADC (analog-to-digital converter). The power supplies are further regulated and stabilized with two voltage regulator circuits 2501 and 2503 to reduce power noise such that the audio signal output achieves a +/−8-12 v, 600 mw, SNR>120 db maximum amplification output and lossless audio THD+N 0.0004% sound quality Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle. The claims as filed are intended to be as comprehensive as possible, and NO subject matter is intentionally relinquished, dedicated, or abandoned.

What is claimed is:

1. A circuit construction of a portable handheld device for processing high resolution and playing back digital audio data with high fidelity, wherein the circuit construction comprises:
    a multi-layer PCB board;
    a multi-core digital signal micro-processor, embedded with a set of digital audio CODECs for 24 bit audio data processing, being mounted onto said PCB board;
    a field programmable gate array encoder and decoder that is in electronic communication with said multi-core digital signal micro-processor, being mounted onto said PCB board;
    a wireless transceiver that is in electronic communication with said field programmable gate array encoder and decoder;
    a digital-to-analog converter that is in electronic communication with said multi-core digital signal micro-processor, being mounted onto said PCB board;
    a set of differential operational audio amplifiers that are in electronic communication with said digital-to-analog converter, being mounted onto said PCB board; and
    a dual power supply management circuit having a set of low-noise linear regulator circuits, in electronic communication with digital-to-analog converter and said set of differential operational audio amplifiers, providing independent power management for said digital-to-analog converter and said set of differential operational audio amplifiers.

2. The circuit construction of claim 1, wherein said multi-layer PCB board is a 6 layer PCB board comprising a top signal layer, a ground plane, a power plane, a signal layer, a ground plane, and bottom signal layer.

3. The circuit construction of claim 1, wherein said set of digital audio CODECs decode and encode 24 bit digital audio data transmitted in either AIRPLAY format or DLNA format or AIRPLAY format and DLNA format simultaneously.

4. The circuit construction of claim 1, wherein said wireless transceiver is configured to transmit both Wi-Fi and Bluetooth signals.

5. The circuit construction of claim 1, further comprises a power supply circuit for 5V USB output as a USB charger.

6. The circuit construction of claim 1, wherein said high fidelity digital-to-analog converter is configured to generate S/PDIF formatted audio data.

7. The circuit construction of claim 1, wherein said multi-core digital signal micro-processor is an ARM quad-core A9 microprocessor.

8. The circuit construction of claim 1, wherein said set of differential operational audio amplifiers comprises OPA2134 chips.

9. The circuit construction of claim 1, wherein said digital-to-analog converter includes PCM1792 chips.

10. The circuit construction of claim 1, wherein said power supply management circuit includes TPS6513 chips.

11. The circuit construction of claim 1, wherein said set of low-noise linear regulator circuits includes TPS7A3301 and TPS7A4701.

12. The circuit construction of claim 1, further comprises a stereo high fidelity headphone driver.

13. The circuit construction of claim 12, wherein said stereo high fidelity headphone driver includes TPA6120A2 chips.

14. The circuit construction of claim 13 is housed in a handhold-able sized housing.

15. The circuit construction of claim 14 wherein said housing is configured with a rotary knob structure and push-button.

16. The circuit construction of claim 15, wherein said rotary knob is coupled with a rotary encoder.

17. The circuit construction of claim 15 further comprises a power supply management circuit configured onto a PCB board mounted inside said rotary knob structure.

18. The circuit construction of claim 12, wherein said dual power supply management circuit provides a +/−8-12 v output power supply and said circuit generates a 600 mW, SNR greater than 120 db THD+N around 0.0004% quality sound effect.

19. The circuit construction of claim 1, further comprises a USB OTG circuit.

20. A circuit construction of a portable handheld device for processing high resolution digital audio data with high fidelity, wherein the circuit construction comprises:
a multi-layer PCB board;
a multi-core digital signal micro-processor, embedded with a set of digital audio CODECs for 24 bit audio data processing, being mounted onto said PCB board;
a digital-to-analog converter that is in electronic communication with said multi-core digital signal micro-processor, being mounted onto said PCB board;
a set of differential operational audio amplifiers that are in electronic communication with said digital-to-analog converter, being mounted onto said PCB board; and
a dual power supply management circuit having a set of low-noise linear regulator circuits, in electronic communication with digital-to-analog converter and said set of differential operational audio amplifiers, providing independent power management for said digital-to-analog converter and said set of differential operational audio amplifiers.

21. The circuit construction of claim 20, wherein said multi-layer PCB board is a 6 layer PCB board comprising a top signal layer, a ground plane, a power plane, a signal layer, a ground plane, and bottom signal layer.

22. The circuit construction of claim 20, wherein said set of digital audio CODECs decode and encode 24 bit digital audio data transmitted in either AIRPLAY format or DLNA format or AIRPLAY format and DLNA format simultaneously.

23. The circuit construction of claim 20, wherein said multi-core digital signal micro-processor is an ARM quad-core A9 microprocessor.

24. The circuit construction of claim 20, wherein said set of differential operational audio amplifiers comprises OPA2134 chips.

25. The circuit construction of claim 20, wherein said digital-to-analog converter includes PCM1792 chips.

26. The circuit construction of claim 20, wherein said power supply management circuit includes TPS6513 chips.

27. The circuit construction of claim 20, wherein said set of low-noise linear regulator circuits includes TPS7A3301 and TPS7A4701.

28. The circuit construction of claim 20, further comprises a stereo high fidelity headphone driver.

29. The circuit construction of claim 28, wherein said stereo high fidelity headphone driver includes TPA6120A2 chips.

30. The circuit construction of claim 29, wherein said dual power supply management circuit provides a +/−8-12 v output power supply and said circuit generates a 600 mW, SNR greater than 120 db THD+N around 0.0004% quality sound effect.

* * * * *